(12) United States Patent
Kato

(10) Patent No.: US 7,633,824 B2
(45) Date of Patent: Dec. 15, 2009

(54) CHARGE PUMP TO SUPPLY VOLTAGE BANDS

(75) Inventor: Kenta Kato, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 156 days.

(21) Appl. No.: 12/012,389

(22) Filed: Feb. 1, 2008

(65) Prior Publication Data
US 2008/0205134 A1 Aug. 28, 2008

(30) Foreign Application Priority Data
Feb. 1, 2007 (JP) ............................. 2007-022714

(51) Int. Cl.
*G11C 5/14* (2006.01)
(52) U.S. Cl. .................. 365/226; 365/189.09
(58) Field of Classification Search ............ 365/185.23, 365/189.09, 226, 230.06
See application file for complete search history.

(56) References Cited

U.S. PATENT DOCUMENTS

| 5,041,739 | A | 8/1991 | Goto | |
| 6,275,096 | B1 * | 8/2001 | Hsu et al. | 327/535 |
| 6,335,893 | B1 * | 1/2002 | Tanaka et al. | 365/226 |
| 6,473,321 | B2 | 10/2002 | Kishimoto et al. | |
| 6,760,262 | B2 * | 7/2004 | Haeberli et al. | 365/189.09 |
| 7,180,362 | B2 | 2/2007 | Senda et al. | |
| 7,307,897 | B2 * | 12/2007 | Shin | 365/189.09 |

\* cited by examiner

*Primary Examiner*—Anh Phung

(57) ABSTRACT

The present invention provides a voltage generating circuit and a control method thereof which is capable of preventing an increase in the occupied area and suitable for raising the voltage of the power supply in a wide range.

This voltage generating circuit comprises a first charge pump unit to which a first clock signal is inputted, wherein the first charge pump unit generates a voltage by pumping a voltage of a first external power supply in stages by a first voltage, a voltage selector that selects the voltage generated by the first charge pump unit or a voltage of a second external power supply in accordance with a voltage selection command signal, a level converter that converts a voltage level of the first clock signal into a second voltage level, and a second charge pump unit to which the second clock signal that has been converted by the level converter is inputted, wherein the second charge pump unit and that generates a voltage and by pumping the selected voltage or the voltage of the second external power supply.

19 Claims, 7 Drawing Sheets

CHARGE PUMP TO SUPPLY VOLTAGE BANDS

CLAIM OF PRIORITY

This applications claims priority from Japanese patent application 2007-022714 filed Feb. 1, 2007 which was not published in English.

BACKGROUND OF THE INVENTION

1. Field of the Invention

The present invention relates to a voltage generating circuit and a control method thereof.

2. Description of the Related Art

In a nonvolatile memory such as a flash memory, a high voltage of ±16 V or more is necessary to perform write operations and erase operations in its memory cell. For this reason, a conventional nonvolatile memory is equipped with a voltage generating circuit which raises a power supply voltage of, for example, 1.8 V to 3 V in order to generate a high voltage in the memory chip.

Unexamined Japanese Patent Publication No. 2002-26254 discloses a semiconductor integrated circuit including a nonvolatile memory having the aforementioned voltage generating circuit. In this semiconductor integrated circuit, a charge pump in which the voltage generating circuit carries out a first stage voltage pumping based on a power supply voltage is connected in parallel in terms of the capacity while a charge pump which carries out a second stage voltage pumping based on the voltage raised by the aforementioned charge pump is connected in series in terms of the capacity.

In the above-described semiconductor integrated circuit, if the first stage voltage pumping is carried out by the capacity parallel connection type charge pump, the charged electricity is accumulated in parasitic capacity even if the quantity of connection stages of the capacity component is increased (distinguishable from a case of carrying out the first stage voltage pumping by a capacity series connection type charge pump), thereby causing no such inconvenience that a raised voltage is saturated.

Further, in the above-described semiconductor integrated circuit, even if the second stage voltage pumping is carried out by the capacity series connection type charge pump, the voltages applied to the capacity component of each of the stages connected in series become substantially equal, thereby facilitating pressure resistant design. Therefore, the above-described semiconductor integrated circuit causes no inconvenience as described above compared with a case of carrying out the first stage voltage pumping by the capacity series connection type charge pump while carrying out the second stage voltage pumping by the capacity parallel connection type charge pump. Thus, the semiconductor integrated circuit can raise the voltage of a power supply effectively so as to generate a high voltage.

SUMMARY OF THE INVENTION

To generate a high voltage corresponding to a power supply voltage in a wide range of 1.8 V to 3 V by means of the charge pump in the semiconductor integrated circuit, the quantity of voltage increasing stages of the voltage generating circuit needs to be increased compared with raising the power supply voltage of 3 V to the same voltage as a predetermined high voltage in order to raise the power supply voltage of 1.8 V to the predetermined high voltage. As a consequence, in the semiconductor integrated circuit, it comes that an occupied area of the voltage generating circuit is increased with an increase of the quantity of the voltage increasing stages.

Because the quantity of the voltage increasing stages has been determined to correspond to raising of the power supply voltage of 1.8 V to the predetermined high voltage in the semiconductor integrated circuit, only some of the voltage increasing stages need to be used in order to raise the power supply voltage of 3 V to the same voltage as the predetermined high voltage. Thus, in the semiconductor integrated circuit, all the voltage increasing stages are not used in order to raise the power supply voltage of 3 V to the same voltage as the predetermined high voltage and therefore, optimality in the design of the voltage generating circuit is difficult to achieve.

In view of the above circumstances, the present invention has been made to provide a voltage generating circuit and control method which is suitable for raising the voltage of the power supply in a wide range and is capable of preventing an increase in the occupied area and According to one embodiment of the present invention, a voltage generating circuit in which a plurality of charge pumps are arranged between an input and an output comprises: a first charge pump unit to which a first clock signal having a first voltage level is inputted, the first charge pump unit generating a first precharge pumping voltage by pumping a voltage of a first external power supply in stages by a first voltage; a voltage selector that is connected to any one of the first power supply and a second external power supply having a higher voltage value than the first external power supply, the voltage selector selecting from the first precharge pumping voltage generated by the first charge pump unit or the voltage of the second external power supply, in accordance with a voltage selection command signal; a level converter that converts a voltage level of the first clock signal into a second voltage level that is higher than the first voltage level; a second charge pump unit to which a second clock signal having the second voltage level is inputted, the second charge pump unit generating a second precharge pumping voltage by pumping the first precharge pumping voltage or the voltage of the second external power supply selected by the voltage selector in stages by a second voltage with a greater potential difference than the first voltage.

The voltage generating circuit according to the embodiment can select the first precharge pumping voltage which is obtained by pumping the voltage of the first external power supply or the second external power supply voltage which is higher than the first external power supply by the provision of the voltage selector and bring the selected voltage value closer to a voltage outputted by the voltage generating circuit.

According to the embodiment, the voltage having a value close to a voltage value outputted by the voltage generating circuit is pumped by the second charge pump unit so as to generate the second precharge pumping voltage, therefore, the time required until the second precharge pumping voltage is reached can be accelerated. Consequently, this embodiment can raise the efficiency of pumping the voltage to the second precharge pumping voltage.

Further, according to this embodiment, by making a difference of potential at the second voltage of the second charge pump unit wider than the potential difference of the first voltage of the first charge pump unit, the quantity of the voltage increasing stages of the second charge pump unit can be reduced compared with a case of determining the quantity of the voltage increasing stages based on the potential difference of the first voltage. Then, according to this embodiment, the occupied area of the second charge pump unit can be reduced with a decrease in the quantity of the voltage increasing stages of the second charge pump unit, so that the occupied area of the voltage generating circuit can be reduced.

According to another embodiment, a control method of a voltage generating circuit including a plurality of pumping step for generating a precharge pumping voltage between an input and an output, comprises: a first pumping step that uses a first clock signal having a first voltage level so as to generate a first precharge pumping voltage by pumping a voltage of a first external power supply in stages by a first voltage; a voltage selecting step that uses the first external power supply or a second external power supply having a higher voltage value than the first external power supply so as to select from the first precharge pumping voltage generated by the first pumping step and a voltage of the second external power supply, in accordance with a voltage selection command signal; a level converting step that converts a voltage level of the first clock signal to a second voltage level that is higher than the first voltage level, and a second pumping step that uses the second clock signal having the second voltage level converted by the level converting step so as to generate a second precharge pumping voltage by pumping the first precharge pumping voltage or the voltage of the second external power supply selected by the voltage selecting step in stages by a second pumping step with a greater potential difference than the first voltage.

The control method of the voltage generating circuit of this embodiment enables any one of the first precharge pumping voltage which is obtained by pumping the voltage of the first external power supply and a second external power supply voltage which is higher than the first external power supply to be selected by the provision of the voltage selecting step and the selected voltage value to be brought closer to a voltage outputted by the voltage generating circuit.

According to this embodiment, the voltage having a value close to a voltage value outputted by the voltage generating circuit is pumped by the second pumping step so as to generate the second precharge pumping voltage. As such, the time required until the second precharge pumping voltage is reached can be decreased. Consequently, the invention of claim 10 can raise the efficiency of pumping the voltage to the second precharge pumping voltage.

Further, according to this embodiment, by making a difference of potential at the second voltage of the second pumping step wider than the potential difference of the first voltage of the first pumping step, the quantity of the voltage increasing stages of the second pumping steps can be reduced compared with a case of determining the quantity of the voltage increasing stages based on the potential difference of the first voltage.

The voltage generating circuit and control method thereof of the present invention enable any one of a first precharge pumping voltage which is obtained by pumping the voltage of the first external power supply and a second external power supply voltage which is higher than the first external power supply to be selected and the selected voltage value to be brought closer to a voltage value outputted by the voltage generating circuit.

Further, because the voltage having a value close to the voltage value outputted by the voltage generating circuit is pumped so as to generate the second precharge pumping voltage, the time required until the second precharge pumping voltage is reached can be accelerated. Accordingly, the present invention can raise the efficiency of pumping the voltage to the second precharge pumping voltage.

Further, according to the present invention, by making the difference of potential of the second voltage wider than the potential difference of the first voltage, the quantity of the voltage increasing stages of the second pumping step can be reduced as compared with a case of determining the quantity of the voltage increasing stages based on the potential difference of the first voltage.

DETAILED DESCRIPTION

Figure 1:
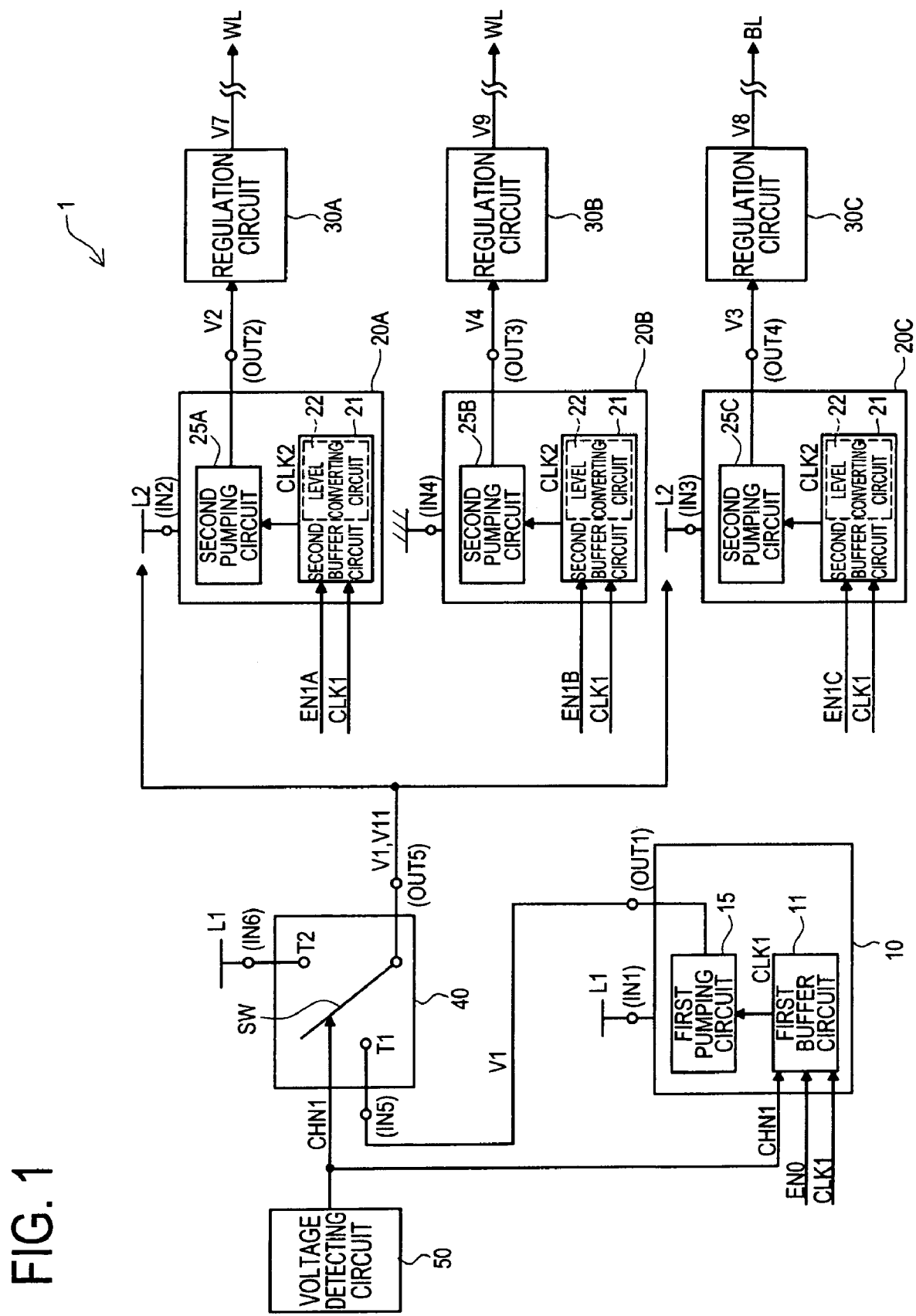
FIG. 1 is a block diagram showing the structure of a voltage generating unit of a flash memory according to the first embodiment.

A first embodiment of the present invention will be described with reference to FIG. 1. The voltage generating circuit of the present invention will be described by taking a voltage generating unit possessed by a flash memory as an example. FIG. 1 is a block diagram showing the structure of a voltage generating portion 1 of the flash memory. The voltage generating portion 1 includes a first charge pump circuit 10, a second charge pump circuit 20, a regulation circuit 30 and a selection circuit 40.

A first charge pump circuit 10 includes a first buffer circuit 11 and a first pumping circuit 15. The first buffer circuit 11 is connected to a control circuit and an oscillation circuit (not shown). Further, the first buffer circuit 11 is connected to a voltage detecting circuit 50. The first pumping circuit 15 is connected to an external power supply line L1 via an input terminal (IN1). According to this embodiment, the value of the external power supply voltage is set to 1.8 V or 3 V. The output of the first pumping circuit 15 is connected to an output terminal (OUT1). In the meantime, the external power supply whose voltage value is 1.8 V corresponds to a first external power supply of the present invention. The external power supply whose voltage value is 3 V corresponds to a second external power supply of the present invention.

According to this embodiment, the voltage generating portion 1 includes three second charge pump circuits 20A, 20B, 20C. The second charge pump circuit 20A has a second buffer circuit 21 and a second pumping circuit 25A. The second charge pump circuit 20C has a second buffer circuit 21 and a second pumping circuit 25C.

The input of each second buffer circuit 21 is connected to the control circuit and the oscillation circuit. The output of a level converting circuit 22 possessed by each of the second buffer circuit 21 is connected to the input of the second pumping circuit 25A, the input of the second pumping circuit 25B and the input of the second pumping circuit 25C.

A second pumping circuit 25A of the second charge pump circuit 20A is connected to an internal power supply line L2 via an input terminal (IN2). The output of the second pumping circuit 25A is connected to an output terminal (OUT2).

The second pumping circuit 25C of the second charge pump circuit 20C are connected to the internal power supply line L2 via an input terminal (IN3). The output of the second pumping circuit 25C is connected to an output terminal (OUT4).

The second charge pump circuit 20B includes a second buffer circuit 21 and a second pumping circuit 25B. The second buffer circuit 21 of the second charge pump circuit 20B is constructed in the same way as the second buffer circuit 21 of the second charge pump circuits 20A, 20C. The input of the second buffer circuit 21 of the second charge pump circuit 20B is connected to the oscillation circuit and the control circuit. The output of the level converting circuit 22 of the second buffer circuit 21 is connected to the input of the second pumping circuit 25B.

The second pumping circuit 25B is connected to the ground via an input terminal (IN4). The output of the second pumping circuit 25B is connected to an output terminal (OUT3).

The input of a regulation circuit 30A is connected to the output terminal (OUT2) of the second charge pump circuit 20A. The output of the regulation circuit 30A is connected to a word line WL. The input of a regulation circuit 30B is connected to the output terminal (OUT3) of the second charge pump circuit 20B. The output of the regulation circuit 30B is connected to the word line WL. The input of a regulation circuit 30C is connected to the output terminal (OUT4) of the second charge pump circuit 20C. The output of the regulation circuit 30C is connected to a bit line BL.

The selection circuit 40 includes an input terminal (IN5), an input terminal (IN6), a switch SW, terminals T1, T2 and an output terminal (OUT5). The input terminal (IN5) is connected to the output terminal (OUT1) of the first charge pump circuit 10. Further, the input terminal (IN5) is connected to the terminal T1. The terminal T2 is connected to the external power supply line L1 via the input terminal (IN6). The switch SW is connected to the voltage detecting circuit 50 and the output terminal (OUT5). The output terminal (OUT5) is connected to the internal power supply line L2.

Next, the operation of the voltage generating portion 1 of the first embodiment will be described. First, an operation in case that the voltage detecting circuit 50 detects that the value of the external power supply voltage is 1.8 V will be described. According to this embodiment, if the voltage detecting circuit 50 detects that the value of the external power supply voltage is 1.8 V, the voltage detecting circuit 50 outputs a high level selection signal CHN1 to the switch SW of the selection circuit 40. When the switch SW receives the high level selection signal CHN1, it is connected to the terminal T1. At the same time, the voltage detecting circuit 50 outputs the high level selection signal CHN1 to the first buffer circuit 11 of the first charge pump circuit 10. In the meantime, the selection signal CHN1 corresponds to the voltage selection command signal of the present invention.

According to this embodiment, if a first operation clock signal CLK1 having an amplitude of 1.8 V is inputted to the first buffer circuit 11 by the oscillation circuit and a high level control signal EN0 is inputted to the first buffer circuit 11 by the control circuit, the first buffer circuit 11 outputs the first operation clock signal CLK1 having an amplitude of 1.8 V to the first pumping circuit 15. In the meantime, the first operation clock signal CLK1 corresponds to a first clock signal of the present invention and 1.8 V corresponds to a first voltage level of the invention.

When the first operation clock signal CLK1 is inputted to the first pumping circuit 15, the first pumping circuit 15 starts voltage pumping operation. According to this embodiment, the first pumping circuit 15 is constructed of a capacity parallel connection type charge pump in which voltage pumping capacitors are connected through a plurality of stages. In the charge pump, a voltage pumping stage is formed of each voltage pumping capacitor. The first pumping circuit 15 is supplied with an external power supply voltage of 1.8 V by the external power supply line L1 so as to accumulate electric charges in the voltage pumping capacitor on a first stage.

After that, in the first pumping circuit 15, a voltage of 1.8 V is supplied to the voltage pumping capacitor via the control terminal connected to the voltage pumping capacitor on the first stage by the first operation clock signal CLK1. As a consequence, electric charges are accumulated in the voltage pumping capacitor on the first stage so that voltage between both ends of the capacitor rises.

Subsequently, the electric charges accumulated in the voltage pumping capacitor on the first stage is supplied to the voltage pumping capacitor on a next stage. Then, like the voltage pumping capacitor on the first stage, the voltage of 1.8 V is supplied to the voltage pumping capacitor on the next stage by the first operation clock signal CLK1. Consequently, in the first pumping circuit 15, the voltage between both ends of the voltage pumping capacitor is raised step by step by the plurality of the voltage pumping capacitors, so that the voltage of 1.8 V is raised toward the voltage of near 3 V gradually. According to this embodiment, voltage pumping interval of 1.8 V corresponds to a first voltage of the invention.

If a low level control signal EN0 is inputted to the first buffer circuit 11 by the control circuit, the first buffer circuit 11 does not output the first operation clock signal CLK1 to the first pumping circuit 15. As a consequence, the first pumping circuit 15 stops its voltage pumping operation.

The first charge pump circuit 10 supplies a pumping voltage V1 having a voltage value near 3 V to the selection circuit 40. The pumping voltage V1 undergoes subtraction/addition processing by a regulation circuit (not shown) so that the voltage value is adjusted to 3 V. Because the pumping voltage V1 is a result of pumping the voltage of 1.8 V to a voltage near 3 V by a plurality of the voltage pumping capacitors, it corresponds to a first precharge pumping voltage of the present invention.

The pumping voltage V1 is supplied to the internal power supply line L2 via the input terminal (IN5) of the selection circuit 40, the terminal T1, the switch SW and the output terminal (OUT5). According to this embodiment, if the first operation clock signal CLK1 having an amplitude of 1.8 V is inputted to the second buffer circuit 21 of each of the second charge pump circuits 20A-20C by the oscillation circuit and high level control signals EN1A-EN1C are inputted to the second buffer circuit 21 of each of the second charge circuits 20A-20C by the control circuit, each of the level converting circuits 22 converts the first operation clock signal CLK1 to the second operation clock signal CLK2 having an amplitude of 3 V. In the meantime, 3 V corresponds to a second voltage level of the present invention. The level converting circuit 22 corresponds to a level converter of the present invention. The level converting circuit 22 outputs the second operation clock signal CLK2 having an amplitude of 3 V to each of the second pumping circuits 25A-25C. In the meantime, the second operation clock signal CLK2 corresponds to a second clock signal of the present invention.

When the second operation clock signal CLK2 is inputted to each of the second pumping circuits 25A, 25C, each of the second pumping circuits 25A, 25C starts its pumping operation. The second pumping circuits 25A, 25C are constructed of the capacity parallel connection type charge pump in which the pumping capacitors are connected through a plurality of stages. In the charge pump, the pumping stage is formed of each pumping capacitor.

Each of the second pumping circuits 25A, 25C is supplied with a voltage of 3 V by the internal power supply line L2, so as to accumulate electric charges in the pumping capacitor on the first stage. After that, in each of the second pumping circuits 25A, 25C, a voltage of 3 V is supplied to the pumping capacitor via the control terminal connected to the pumping capacitor on the first stage by the second operation clock signal CLK2. As a consequence, electric charges are accumulated in the pumping capacitor on the first stage so that a voltage between both ends of the capacitor rises.

After that, in each of the second pumping circuits 25A, 25C, a similar pumping operation as the first pumping circuit 15 is carried out so as to pump the voltage of 3 V to a voltage near 9 V. The second pumping circuit 25A outputs a pumping voltage V2 having a voltage value near 9 V to the regulation circuit 30A via the output terminal (OUT2). The second pumping circuit 25C outputs a pumping voltage V3 having a voltage value near 9 V to the regulation circuit 30C via the output terminal (OUT4). According to this embodiment, the pumping voltage V2 and the pumping voltage V3 correspond to the second precharge pumping voltage of the present invention. The pumping interval of 3 V corresponds to a second voltage of the invention.

In the meantime, if low level control signals EN1A, EN1C are inputted to each of the second buffer circuits 21 by the control circuit, each of the second buffer circuits 21 does not output the second operation clock signal CLK2 to the second pumping circuits 25A, 25C. As a consequence, the second pumping circuits 25A, 25C stop each pumping operation.

The regulation circuit 30A carries out addition/subtraction processing on the pumping voltage V2 so as to generate an adjustment voltage V7. After that, the regulation circuit 30A supplies an adjustment voltage V7 having a voltage value of 9 V to the word line WL. The regulation circuit 30C carries out addition/subtraction on the pumping voltage V3 so as to generate an adjustment voltage V8. After that, the regulation circuit 30C supplies the adjustment voltage V8 having a voltage value of 5 V to the bit line BL.

In the second charge pumping circuit 20B, when the second operation clock signal CLK2 is inputted to the second pumping circuit 25B, the second pumping circuit 25B starts its voltage-down operation. According to this embodiment, the second pumping circuit 25B is constructed of capacity parallel connection type negative voltage charge pump in which voltage-down capacitors are connected in a plurality of stages. In the negative voltage charge pump, a voltage-down stage is formed of each voltage-down capacitor.

In the second pumping circuit 25B, a voltage of 3 V is supplied to the voltage-down capacitor by the second operation clock signal CLK2 via the control terminal connected to each voltage-down capacitor. In the second pumping circuit 25B, the potential is lowered by each stage so that a voltage near −9 V is generated. The second pumping circuit 25B supplies a negative voltage V4 having a voltage value near −9 V to the regulation circuit 30B via the output terminal (OUT3).

In the meantime, when a low level control signal EN1B is inputted to the second buffer circuit 21 by the control circuit, the second buffer circuit 21 does not output the second operation clock signal CLK2 to the second pumping circuit 25B. As a consequence, the second pumping circuit 25B stops the voltage-down operation.

The regulation circuit 30B carries out addition/subtraction processing on the negative voltage V4 so as to generate an adjustment voltage V9. After that, the regulation circuit 30B supplies the adjustment voltage V9 having a voltage value of −9 V to the word line WL at the time of erasing.

On the other hand, when it is detected that the value of the external power supply voltage is 3 V by the voltage detecting circuit 50, the following activity occurs. According to this embodiment, when the voltage detecting circuit 50 detects that the value of the external power supply voltage is 3 V, the voltage detecting circuit 50 outputs a low level selection signal CHN1 to the switch SW of the selection circuit 40. The switch SW is connected to the terminal T2 when it receives the low level selection signal CHN1.

At the same time, the voltage detecting circuit 50 outputs the low level selection signal CHN1 to the first buffer circuit 11 of the first charge pump circuit 10. At this time, the first buffer circuit 11 does not output the first operation clock signal CLK1 to the first pumping circuit 15. Then, the first pumping circuit 15 carries out no voltage pumping operation and pumping voltage V1 is not supplied to the selection circuit 40.

External power supply voltage V11 having a voltage value of 3 V is supplied to the internal power supply line L2 via the input terminal (IN6), terminal T2, switch SW and output terminal (OUT5). The second pumping circuit 25A carries out the above-described pumping operation so as to supply the pumping voltage V2 to the regulation circuit 30A through the output terminal (OUT2). Further, the second pumping circuit 25C carries out a similar pumping operation as the second pumping circuit 25A so as to supply the pumping voltage V3 to the regulation circuit 30C via the output terminal (OUT4). The voltage-down operation of the second pumping circuit 25B when the value of the external power supply voltage is 3 V is similar to the voltage-down operation of the second pumping circuit 25B when the value of the external power supply voltage is 1.8 V.

In this embodiment, the first operation clock signal CLK1 is inputted to the first pumping circuit 15 of the first charge pump 10, the first pumping circuit 15 pumps up the external power supply voltage of 1.8 V toward the voltage near 3 V gradually by a plurality of voltage pumping capacitors. The first charge pump circuit 10 corresponds to a first charge pump unit of the present invention. Pumping up the external power supply voltage of 1.8 V to the voltage near 3 V gradually using the first operation clock signal CLK1 corresponds to a first pumping step of the present invention.

In this embodiment, the switch SW of the selection circuit 40 is connected to the terminal T1 when it receives a high level selection signal CHN1. Consequently, the selection circuit 40 can select the pumping voltage V1 supplied by the first charge pump circuit 10. Contrary to this, the switch SW of the selection circuit 40 is connected to the terminal T2 when it receives the low level selection signal CHN1. Consequently, the selection circuit 40 can select the external power supply voltage V11 of 3 V supplied via the terminal T2. Therefore, the selection circuit 40 corresponds to a voltage selector of the present invention because the switch SW selects the pumping voltage V1 or the external power supply voltage V11 corresponding to the received selection signal CHN1.

Selecting the pumping voltage V1 corresponding to the high level selection signal CHN1 and selecting the external power supply voltage V11 corresponding to the low level selection signal CHN1 corresponds to the voltage selection step of the present invention. Further, converting the first operation clock signal CLK1 having an amplitude of 1.8 V to the second operation clock signal CLK2 having an amplitude of 3 V corresponds to a level converting step of the present invention.

According to this embodiment, the second operation clock signal CLK2 is inputted to the second pumping circuits 25A, 25C of each of the second charge pump circuits 20A, 20C and then, the second pumping circuits 25A, 25C pump up the pumping voltage V1 or the external power supply voltage V11 selected by the selection circuit 40 toward a voltage near 9 V gradually by a plurality of pumping capacitors. Therefore, the second charge pump circuits 20A, 20C correspond to a second charge pump unit of the present invention.

Pumping up the pumping voltage V1 or the external power supply voltage V11 toward a voltage near 9 V gradually using the second operation clock signal CLK2 whose voltage amplitude value is larger than the first operation clock signal CLK1 corresponds to a second pumping step of the present invention.

An example of the flash memory having the voltage generating portion 1 of this embodiment will be described. In the meantime, the flash memory corresponds to a nonvolatile memory device of the present invention. In the voltage generating portion 1 of the flash memory, the control signals EN1A-EN1C are inputted to the second buffer circuit 21 of each of the second charge pumps 20A-20C corresponding to the operation mode of the flash memory.

When the flash memory is operated on program, erased or read (including reading for verification of the program operation and erase operation), the second charge pump circuit 20A is activated with the control signal EN1A. At the time of the program operation, the adjustment voltage V7 having a voltage value of 9 V is supplied to the word line WL of the memory cell by the regulation circuit 30A. At the time of the erase operation, the adjustment voltage V7 is supplied to a well of the memory cell by the regulation circuit 30A. At the time of read operation, the voltage value of the pumping voltage V2 is adjusted to 4 V by the regulation circuit 30A and the adjustment voltage V7 having a voltage value of 4 V is supplied to the word line WL of the memory cell. In the meantime, the memory cell corresponds to a nonvolatile memory device of the present invention.

At the time of erase operation, the second charge pump circuit 20B is activated with the control signal EN1B. At the time of erase operation, the adjustment voltage V9 having a voltage value of −9 V is supplied to the word line WL of the memory cell by the regulation circuit 30B.

At the time of program operation, the second charge pump circuit 20C is activated with the control signal EN1C. At the time of program operation, the adjustment voltage V8 having a voltage value of 5 V is supplied to the bit line BL of the memory cell by the regulation circuit 30C. By the operation of each of the second charge pump circuits 20A-20C, programming to the memory cell by the pouring of hot electrons, erasing of the memory cell by FN tunneling and reading from the memory cell are carried out.

In the flash memory, application of a high voltage to the memory cell for the program operation and erase operation and reading for verification of each operation are repeated a plurality of times.

In the flash memory, when it is detected that the value of the external power supply is 1.8 V by the voltage detecting circuit 50, the following operation occurs. At the time of program operation, application of a high voltage to the memory cell for programming and program setting for reading for verification thereof are repeated.

When a high voltage is applied to the memory cell for the aforementioned program, the first charge pump circuit 10 and the second charge pump circuits 20A, 20C are activated with the control signal EN0, the control signal EN1A and the control signal EN1C. At the time of reading for the aforementioned verification, the first charge pump circuit 10 and the second charge pump circuit 20A are activated with the control signal EN0 and the control signal EN1A.

At the time of the erase operation, application of a high voltage to the memory cell for the erase operation and setting for reading for verification thereof are repeated. When a high voltage is applied to the memory cell for the erase operation, the first charge pump circuit 10 and the second charge pump circuits 20A, 20B are activated with the control signal EN0 and the control signals EN1A, EN1B respectively.

At the time of reading, the first charge pump circuit 10 and the second charge pump circuit 20A are activated with the control signal EN0 and the control signal EN1A respectively.

In an operation repeated by the embedded controller, the first charge pump circuit 10 continues to be activated with the control signal EN0 at the time of transition from the program operation or erase operation to the verify operation (read operation) or from the verify operation (read operation) to the program operation or the erase operation. Thus, generation of the pumping voltage V1 is maintained by the activated first charge pump circuit 10. In the flash memory of this embodiment, while the activation of the first charge pump circuit 10 is maintained with the control signal EN0, each of the second charge pumps 20A-20C can be activated or deactivated with the control signals EN1A-EN1C corresponding to each operation such as the program operation.

According to this embodiment, the control signal EN0 corresponds to a first control signal of the invention. The control signals EN1A-EN1C correspond to a second control signal of the invention. In this embodiment, the second charge pump units 20A, 20C correspond to a third charge pump unit of the present invention and the second charge pump unit 20B corresponds to a fourth charge pump unit of the invention. Further, the pumping voltages V2, V3 correspond to a first output voltage of the invention and the negative voltage V4 corresponds to a second output voltage of the invention.

In the voltage generating portion 1 of this embodiment, the provision of the selection circuit 40 enables the selection of one of the pumping voltage V1 obtained by pumping the external power supply voltage of 1.8 V and the external power supply voltages V11 of 3 V and bring the selected voltage value closer to each of the adjustment voltages V7, V8 outputted by the voltage generating portion 1.

In the voltage generating portion 1 of this embodiment, the pumping voltage V1 having a value near each voltage value of the adjustment voltages V7, V8 or the external power supply voltage V11 is pumped up by the second charge pump circuits 20A, 20C so as to generate the pumping voltages V2, V3. Thus, the time that passes until the voltage before pumped up reaches the pumping voltages V2, V3 can be decreased. Thus, the voltage generating portion 1 of this embodiment can raise the efficiency of pumping up the voltage before pumped to the pumping voltages V2, V3.

Furthermore, by setting the pumping interval (3V) of the second pumping circuits 25A, 25C wider than the pumping interval (1.8 V) of the first pumping circuit 15, the quantity of pumping stages of the second pumping circuits 25A, 25C can be reduced compared with a case of determining the quantity of the pumping stages based on the pumping interval (1.8 V) of the first pumping circuit 15. Consequently, the voltage generating portion 1 of this embodiment can reduce the occupied area of the second charge pump circuits 20A, 20C with a decrease in the quantity of the pumping stages of the second pumping circuits 25A, 25C, so as to reduce the occupied area of the voltage generating portion 1.

According to the control method of the voltage generating portion 1 of this embodiment, one of the pumping voltage V1 obtained by pumping the external power supply voltage of 1.8 V and the external power supply voltages V11 of 3 V can be selected and the selected voltage value can be brought closer to each voltage of the adjustment voltages V7, V8 outputted from the voltage generating portion 1.

According to the control method of the voltage generating portion 1 of this embodiment, the pumping voltages V2, V3 are generated by pumping up the pumping voltage V1 having a value near each voltage of the adjustment voltages V7, V8 or the external power supply voltage V11. As such, the time required until the voltage before pumped reaches the pumping voltages V2, V3 can be decreased. Thus, according to the control method of the voltage generating portion 1 of this embodiment, the efficiency of pumping the voltage before pumped to the pumping voltages V2, V3 can be increased.

Furthermore, according to the control method of the voltage generating portion 1 of this embodiment, by setting the pumping interval (3 V) of the second pumping circuits 25A, 25C wider than the pumping interval (1.8 V) of the first pumping circuit 15, the quantity of the pumping stages of the second pumping circuits 25A, 25C can be reduced compared with a case of determining the quantity of the pumping stages based on the pumping interval (1.8 V) of the first pumping circuit 15.

In the flash memory of this embodiment, the first charge pump circuit 10A is activated with the control signal EN0 and at the same time, each of the second charge pumps 20A-20C is activated with the control signals EN1A-EN1C different from the control signal EN0. Then, the flash memory of this embodiment can maintain the activation condition of the first charge pump circuit 10 with the control signal EN0 and activate the second charge pump units 20A-20C with the control signals EN1A-EN1C. Thus, in the flash memory of this embodiment, the second charge pump units 20A-20C can be activated with the control signals EN1A-EN1C different from the control signal EN0 independently of the first charge pump unit 10A so as to accelerate the rise-up activity of the flash memory.

For example, in the flash memory discussed above, while maintaining the activation condition of the first charge pump circuit 10A with the control signal EN0, the second charge pump units 20A-20C can be activated so as to move from the program operation or the erase operation to the read operation or from the read operation to the program operation or the erase operation. Consequently, in the flash memory, the second charge pump units 20A-20C can be controlled to activation condition or deactivation condition corresponding to whether or not the respective control signals EN1A-EN1C are supplied, independently of the first charge pump unit 10 without returning the first charge pump unit 10 to the deactivation condition or the activation condition again. Thus, by controlling the second charge pump units 20A-20C into the activation condition rapidly with the control signals EN1A-EN1C in the flash memory discussed above, embedded controller activities including the program operation, erase operation and read operation can be carried out rapidly.

The flash memory of this embodiment includes the second charge pump circuit 20A for generating the pumping voltage V2 at the time of program operation and the second charge pump circuit 20C for generating the pumping voltage V3 and further the second charge pump circuit 20B for generating the negative voltage V4 at the time of erase operation. Thus, the flash memory of this embodiment can use a different charge pump for each operation so as to generate a voltage corresponding to each operation. Then, in the flash memory of this embodiment, each of the second charge pump units 20A-20C which are different from each other is used to move from the erase operation to the program operation or from the program operation to the erase operation, so as to generate a voltage corresponding to each operation rapidly. Therefore, if the pumping voltages V2, V3 corresponding to the program operation or the negative voltage V4 corresponding to the erase operation are generated rapidly in the flash memory of this embodiment, the program operation and the erase operation can be accelerated corresponding to the pumping voltages V2, V3 or the negative voltage V4.

Figure 2:
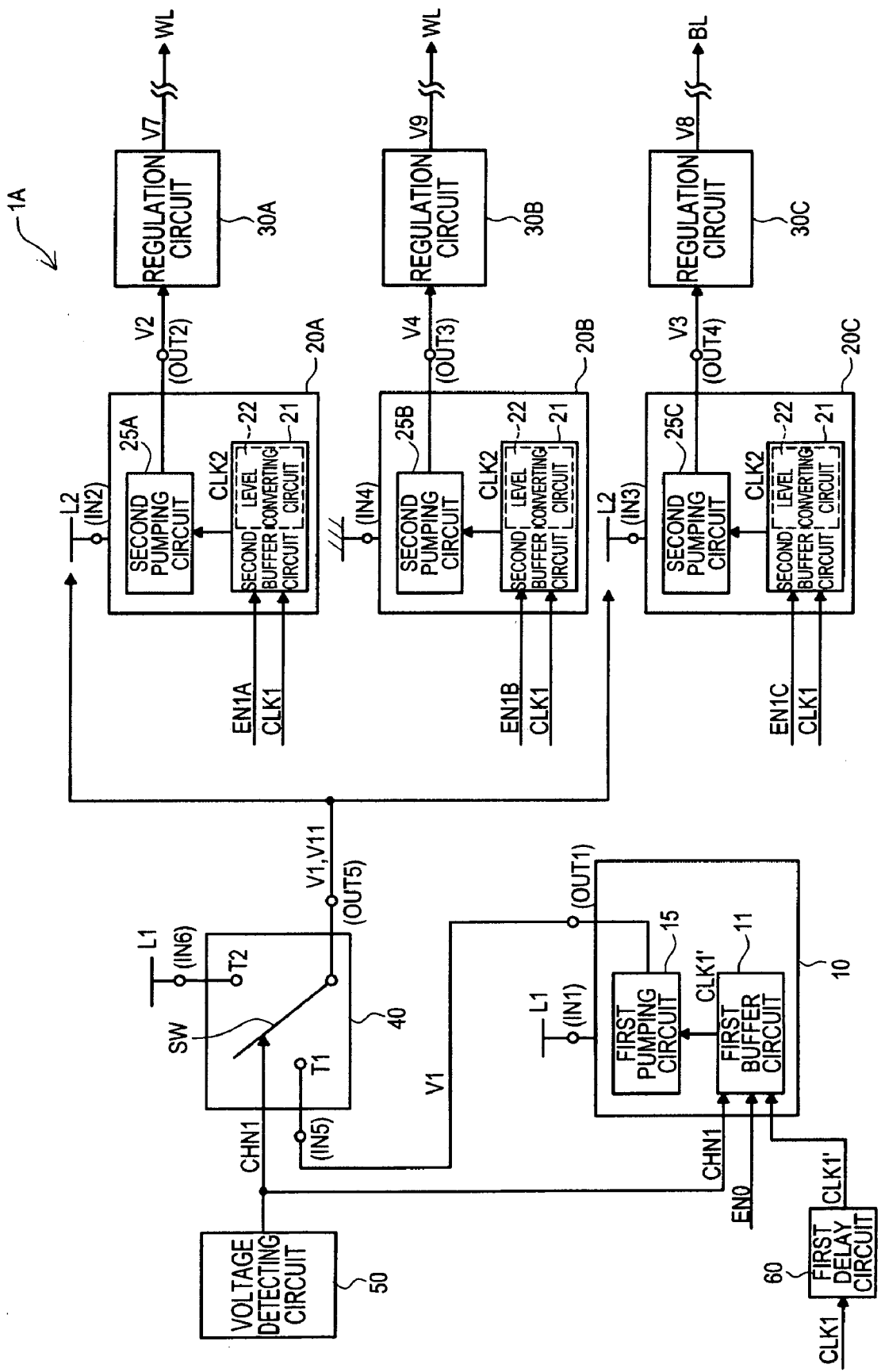
FIG. 2 is a block diagram showing the structure of the same voltage generating unit of the second embodiment.

The second embodiment of the present invention will be described with reference to FIG. 2. The same reference numerals are attached to the same components as the first embodiment and description thereof is omitted. FIG. 2 is a block diagram showing the structure of the voltage generating portion 1A of this embodiment. A voltage generating portion 1A includes a first delay circuit 60 as well as the voltage generating portion 1 of the first embodiment. According to this embodiment, the first delay circuit 60 is constituted of a delay locked loop (DLL) circuit. The input of the first delay circuit 60 is connected to an oscillation circuit (not shown). The output of the first delay circuit 60 is connected to the first buffer circuit 11 of the first charge pump circuit 10.

In this embodiment, the voltage generating portion 1A is operated as follows. An activity in the case the value of the external power supply voltage is detected to be 1.8 V by the voltage detecting circuit 50 will be described. In this embodiment, the first operation clock signal CLK1 is outputted to the first delay circuit 60 and each of the second buffer circuit 21 of the second charge pump circuits 20A-20C by an oscillation circuit.

When the high level control signals EN1A-EN1C are inputted to each of the second buffer circuits 21 by a control circuit (not shown), the level converting circuit 22 outputs the second operation clock signal CLK2 to each of the second pumping circuits 25A-25C like the first embodiment. Each of the second pumping circuits 25A-25C starts its pumping/step-down operation when the high level (amplitude of 3 V) second operation clock signal CLK2 is inputted.

On the other hand, a first delay circuit 60 generates a delay clock signal CLK1' by delaying the phase of the first operation clock signal CLK1 after a specified delay time elapses. The delay time of the first delay circuit 60 is set to a time longer than the time required until the second operation clock signal CLK2 is outputted to each of the second pumping circuits 25A-25C by each level converting circuit 22. The first delay circuit 60 outputs the delay clock signal CLK1' to the first buffer circuit 11. The delay clock signal CLK1' is outputted to the first pumping circuit 15 via the first buffer circuit 11. The first pumping circuit 15 starts its pumping operation when the high level (amplitude of 1.8 V) delay clock signal CLK1' is inputted. The delay clock signal CLK1' corresponds to a first clock signal of the present invention.

In this embodiment, the phase of the delay clock signal CLK1' is delayed with respect to the phase of the second operation clock signal CLK2 by the first delay circuit 60. Thus, the timing that the delay clock signal CLK1' inputs to the first pumping circuit 15 is delayed by the timing of the second operation clock signal CLK2 that is inputted to each of the second pumping circuits 25A-25C. Consequently, the pumping operation of the first pumping circuit 15 and the voltage pumping/step-down operation of each of the second pumping circuits 25A-25C are carried out at different timings.

In this embodiment, the phase of the delay clock signal CLK1' to be inputted to the first pumping circuit 15 is delayed with respect to the phase of the second operation clock signal CLK2 to be inputted to each of the second pumping circuits 25A-25C. Thus, the first delay circuit 60 corresponds to a clock signal delay portion of the present invention.

¥
Delaying the phase of the delay clock signal CLK1' to be inputted to the first pumping circuit 15 with respect to the phase of the second operation clock signal CLK2 to be inputted to each of the second pumping circuits 25A-25C corresponds to a clock signal delay step of the present invention.

¥
In the voltage generating portion 1A of this embodiment, by delaying the phase of the delay clock signal CLK1' to be inputted to the first pumping circuit 15 by the first delay circuit 60 with respect to the phase of the second operation clock signal CLK2 to be inputted to each of the second pumping circuit 25A-25C, the pumping operation of the first pumping circuit 15 can be started after the pumping/step-down operation of each of the second pumping circuits 25A-25C is started. In the voltage generating portion 1A of this embodiment, the pumping operation of the first charge pump circuit 10 and the pumping/step-down operation of the second charge pump circuits 20A-20C can be carried out at different timings. Thus, the timing that peak current flows into the first charge pump circuit 10 can be made different from the timing that peak current flows into the second charge pump circuits 20A-20C so as to suppress generation of power supply noise.

¥
According to the control method of the voltage generating portion 1A of this embodiment, if the phase of the delay clock signal CLK1' is delayed with respect to the phase of the second operation clock signal CLK2, the pumping operation with the delay clock signal CLK1' can be started after the pumping/step-down operation with the second operation clock signal CLK2 is started. According to the control method of the voltage generating portion 1A of this embodiment, the pumping/step-down operation with the second operation clock signal CLK2 and the pumping operation with the delay clock signal CLK1' can be carried out at different timings. For this reason, the timing that peak current flows by the pumping/step-down operation with the second operation clock signal CLK2 can be made different from the timing that peak current flows by the pumping operation with the delay clock signal CLK1' so as to suppress generation of power supply noise.

Figure 3:
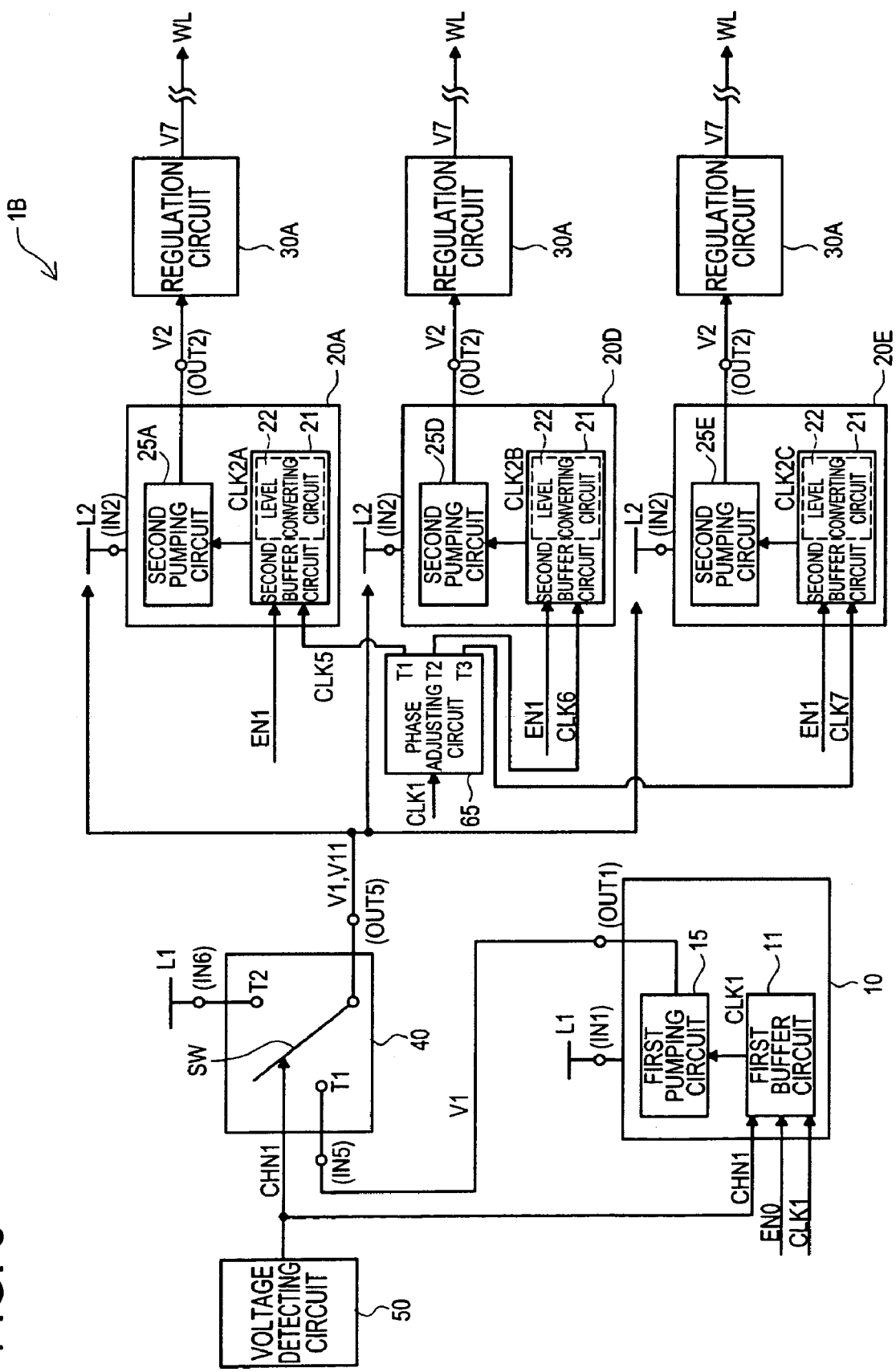
FIG. 3 is a block diagram showing the structure of the same voltage generating unit of the third embodiment.

The third embodiment of the present invention will be described with reference to FIG. 3. The same reference numerals are attached to the same components as the first embodiment and the second embodiment and description thereof is omitted. A symbol EN1 in the same Figure indicates a control signal outputted by a control circuit (not shown). FIG. 3 is a block diagram showing the structure of a voltage generating portion 1B of this embodiment. In the voltage generating portion 1B, three second charge pump circuits 20A, 20D, 20E are connected in parallel. The output terminals (OUT2) of the second charge pump circuits 20A, 20D, 20E are connected to the regulation circuit 30A. The output of the regulation circuit 30A is connected to the word line WL.

The voltage generating portion 1B includes a phase adjusting circuit 65. The input of the phase adjusting circuit 65 is connected to an oscillation circuit (not shown). In this embodiment, the phase adjusting circuit 65 is constructed of the DLL circuit. The phase adjusting circuit 65 includes a 3-phase clock generating portion. The 3-phase clock generating portion is connected to a first output terminal T1, a second output terminal T2 and a third output terminal T3.

The first output terminal T1 is connected to the second buffer circuit 21 of the second charge pump circuit 20A. The second output terminal T2 is connected to the second buffer circuit 21 of the second charge pump circuit 20D. The third output terminal T3 is connected to the second buffer circuit 21 of the second charge pump circuit 20E.

The voltage generating portion 1B is operated as follows. An operation in the case the external power supply voltage is detected to be 1.8 V by the voltage detecting circuit 50 will be described here. According to this embodiment, the first operation clock signal CLK1 is outputted to the first buffer circuit 11 and the phase adjusting circuit 65 by an oscillation circuit.

When the first operation clock signal CLK1 is inputted to a phase adjusting circuit 65, the 3-phase clock generating portion generates a fifth operation clock signal CLK5, a sixth operation clock signal CLK6 and a seventh operation clock signal CLK7, whose phases are different from each other by 90°. The phase adjusting circuit 65 outputs the fifth operation clock signal CLK5 from the first output terminal T1 to the second buffer circuit 21 of the second charge pump circuit 20A. The phase adjusting circuit 65 outputs the sixth operation clock signal CLK6 from the second output terminal T2 to the second buffer circuit 21 of the second charge pump circuit 20D. The phase adjusting circuit 65 outputs the seventh operation clock signal CLK7 from the third output terminal T3 to the second buffer circuit 21 of the second charge pump circuit 20E.

When the fifth operation clock signal CLK5 is inputted to the second buffer circuit 21, the level converting circuit 22 outputs the second operation clock signal CLK2A to the second pumping circuit 25A like the first embodiment and the second embodiment. When the high level (amplitude of 3 V) second operation clock signal CLK2A is inputted, the second pumping circuit 25A starts its pumping operation. The second pumping circuit 25A raises the pumping voltage V1 toward a voltage near 9 V gradually with a plurality of pumping capacitors.

The sixth operation clock signal CLK6 is inputted to the second buffer circuit 21 with its phase delayed by 90° with respect to the fifth operation clock signal CLK5. Consequently, the level converting circuit 22 outputs the second operation clock signal CLK2B to the second pumping circuit 25D. The second operation clock signal CLK2B is delayed by 90° in phase with respect to the second operation clock signal CLK2A.

When the high level (amplitude of 3 V) second operation clock signal CLK2B is inputted, the second pumping circuit 25D raises the pumping voltage V1 toward a voltage near 9 V gradually at a different timing from the second pumping circuit 25A of the second charge pump circuit 20A with a plurality of the pumping capacitors. The seventh operation clock signal CLK7 is inputted to the buffer circuit 21 with its phase delayed by 90° with respect to the sixth operation clock signal CLK6. Consequently, the level converting circuit 22 outputs the second operation clock signal CLK2C to the second pumping circuit 25E. The second operation clock signal CLK2C is delayed by 90° in phase with respect to the second operation clock signal CLK2B.

When the high level (amplitude of 3 V) second operation clock signal CLK2C is inputted, the second pumping circuit 25E raises the pumping voltage V1 toward a voltage near 9 V gradually at a different timing from the second pumping circuit 25D and the second pumping circuit 25E with a plurality of the pumping capacitors.

In this embodiment, the fifth operation clock signal CLK5, the sixth operation clock signal CLK6 and the seventh operation clock signal CLK7, whose phases are different from each other by 90° are generated by the 3-phase clock generating portion possessed by the phase adjusting circuit 65. The phase of the second operation clock signal CLK2B generated by the level converting circuit 22 based on the sixth operation clock signal CLK6 is delayed by 90° with respect to the phase of the second operation clock signal CLK2A generated by the level converting circuit 22 based on the fifth operation clock signal CLK5.

Additionally, the phase of the second operation clock signal CLK2C generated by the level converting circuit 22 based on the seventh operation clock signal CLK7 is delayed by 90° with respect to the phase of the second operation clock signal CLK2B generated by the level converting circuit 22 based on the sixth operation clock signal CLK6. Therefore, the phase adjusting circuit 65 corresponds to a phase adjusting portion of the invention because it can make the fifth operation clock signal CLK5, the sixth operation clock signal CLK6 and the seventh operation clock signal CLK7 different in phase by 90° from each other. Making the fifth operation clock signal CLK5, the sixth operation clock signal CLK6 and the seventh operation clock signal CLK7 different in phase by 90° from each other corresponds to a phase adjusting step of the present invention.

In the voltage generating portion 1B of this embodiment, if the second operation clock signal CLK5, the second operation clock signal CLK6 and the second operation clock signal CLK7, inputted to the second pumping circuits 25A, 25D, 25E of the second charge pump circuits 20A, 20D, 20E are made different in phase by 90° from each other by the phase adjusting circuit 65, the timings of the pumping operations of the second pumping circuits 25A, 25D, 25E of the second charge pump circuits 20A, 20D, 20E connected in parallel can be made different. In the voltage generating portion 1B of this embodiment, the second pumping circuits 25A, 25D, 25E of the second charge pump circuits 20A, 20D, 20E can execute the pumping operation of accumulating electric charges in each pumping capacitor without interruption at a different timing. Therefore, the voltage generating portion 1B of this embodiment can prevent the voltage of the pumping capacitor from dropping by charging the pumping capacitor without interruption, thereby preventing a drop in voltage supply capacity to the word line WL.

According to the control method of the voltage generating portion 1B of this embodiment, by making the second operation clock signal CLK5, the second operation clock signal CLK6 and the second operation clock signal CLK7 different in phase by 90° from each other, the pumping operation timings of the second pumping circuits 25A, 25D, 25E of the second charge pump circuits 20A, 20D, 20E connected in parallel can be made different. Consequently, according to the control method of the voltage generating portion 1B of this embodiment, the pumping operation of accumulating electric charges in the pumping capacitor of the second pumping circuits 25A, 25D, 25E of the second charge pump circuits 20A, 20D, 20E can be carried out at a different timing without interruption. Therefore, according to the control method of the voltage generating portion 1B of this embodiment, when the second pumping circuits 25A, 25D, 25E of the second charge pump circuits 20A, 20D, 20E execute the pumping operation without interruption, the voltage supply capacity to the word line WL can be prevented from dropping.

Figure 4:
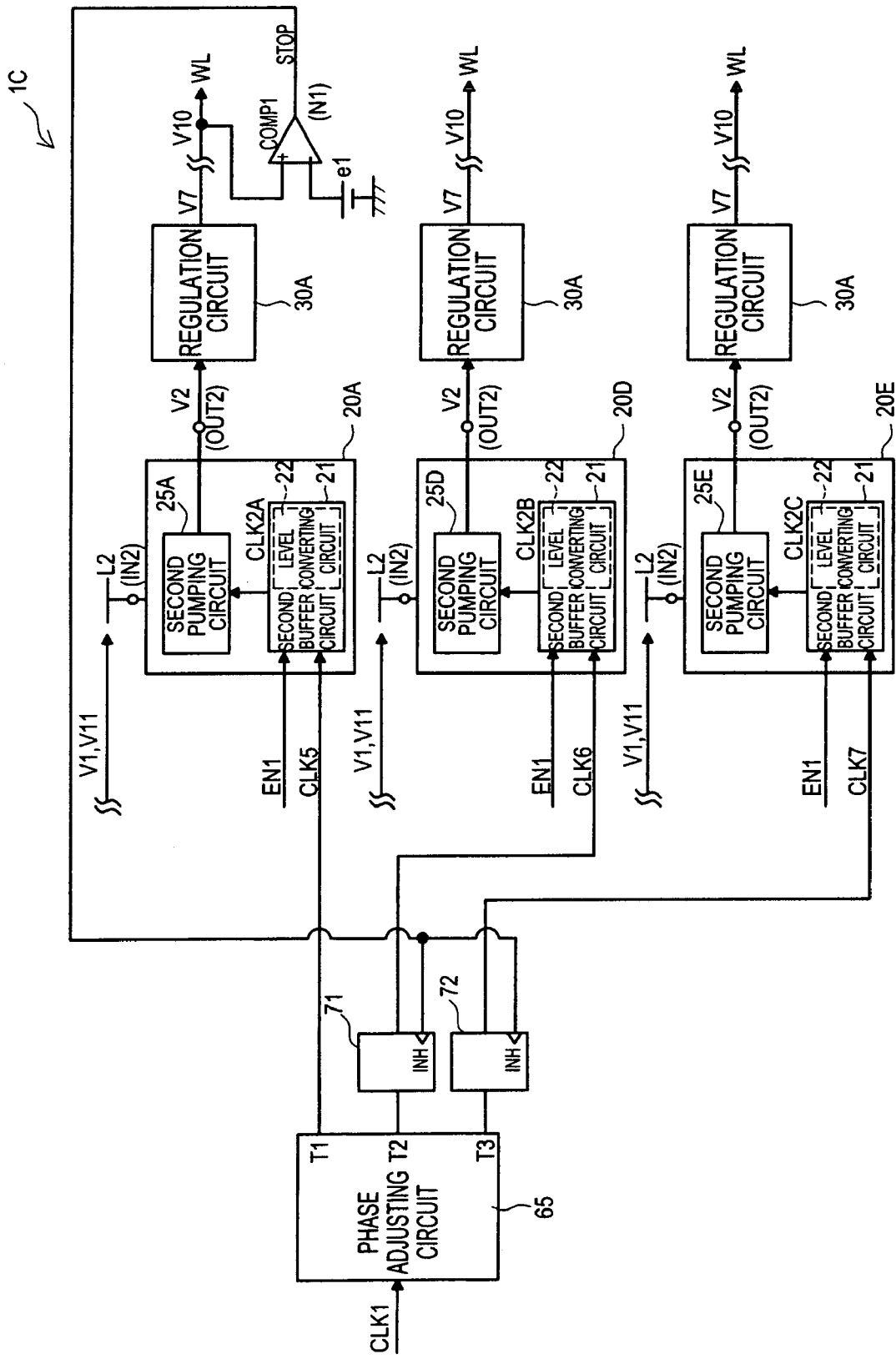
FIG. 4 is a block diagram showing part of the structure of the same voltage generating unit of the fourth embodiment.

A fourth embodiment of the present invention will be described with reference to FIG. 4. The same reference numerals are attached to the same components as the first to third embodiments and description thereof is omitted. FIG. 4 is a block diagram showing part of the structure of the voltage generating portion 1C according to this embodiment. The voltage generating portion 1C includes a comparator COMP1 and third buffer circuits 71, 72 as well as the structure of the voltage generating portion 1B of the third embodiment. In the meantime, in FIG. 4, representation of the first charge pump 10, the selection circuit 40 and the voltage detecting circuit 50 shown in FIG. 3 is omitted.

The non-inverting input terminal of the comparator COMP1 is connected to the word line WL. Reference voltage e1 is connected to the non-inverting input terminal of the comparator COMP1.

The input of the third buffer circuit 71 is connected to the second output terminal T2 of the phase adjusting circuit 65. The output of the third buffer circuit 71 is connected to the second buffer circuit 21 of the second charge pump circuit 20D. The inhibition input terminal (INH) of the third buffer circuit 71 is connected to the output terminal (N1) of the comparator COMP1.

The input of the third buffer circuit 72 is connected to the third input terminal T3 of the phase adjusting circuit 65. The output of the third buffer circuit 72 is connected to the second buffer circuit 21 of the second charge pump circuit 20E. The inhibition input terminal (INH) of the third buffer circuit 72 is connected to the output terminal (N1) of the comparator COMP1.

The voltage generating portion 1C is operated as follows. As described above, the regulation circuit 30A supplies the adjustment voltage V7 to the word line WL. A voltage V10 of the word line WL is inputted to the non-inverting input of the comparator COMP1. The comparator COMP1 compares the voltage V10 of the word line WL with the reference voltage e1. The value of the reference voltage e1 is set to such a value which enables write operation to a memory cell connected to the word line WL to be carried out securely.

If the value of the voltage V10 is higher than the value of the reference voltage e1, the comparator COMP1 outputs a high level signal STOP to each inhibition input terminal (INH) of the third buffer circuits 71, 72. If the value of the voltage V10 is higher than the value of the reference voltage e1, it means that the voltage supply capacity of the voltage generating portion 1C is sufficient. While the high level signal STOP is inputted to the inhibition input terminal (INH) of the third buffer circuit 71, the third buffer circuit 71 does not output the sixth operation clock signal CLK6 to the second buffer circuit 21 of the second charge pump circuit 20D. Consequently, the level converting circuit 22 does not output the second operation clock signal CLK2B to the second pumping circuit 25D. Thus, the pumping operation of the second pumping circuit 25D is stopped, so that no adjustment voltage V7 is supplied to the word line WL.

While the high level signal STOP is inputted to the inhibition input terminal (INH) of the third buffer circuit 72, the third buffer circuit 72 does not output the seventh operation clock signal CLK7 to the second buffer circuit 21 of the second charge pump circuit 20E. Consequently, the level converting circuit 22 does not output the second operation clock signal CLK2C to the second pumping circuit 25E. Thus, the pumping operation of the second pumping circuit 25E is stopped, so that no adjustment voltage V7 is supplied to the word line WL.

On the other hand, if the value of the voltage V10 is lower than the value of the reference voltage e1, the comparator COMP1 outputs a low level signal STOP to each inhibition input terminal (INH) of the third buffer circuits 71, 72. If the value of the voltage V10 is lower than the value of the reference voltage e1, it means that the voltage supply capacity of the voltage generating portion 1C is not sufficient. In this case, the third buffer circuits 71, 72 output the sixth operation clock signal CLK6 and the seventh operation clock signal CLK7 to each of the second buffer circuits 21. Consequently, the second operation clock signal CLK2B and the second operation clock signal CLK2C are outputted to the second pumping circuit 25D and the second pumping circuit 25E by each level converting circuit 22. Thus, the second pumping circuits 25D, 25E continue the pumping operation so that the adjustment voltage V7 is supplied to the word line WL.

According to this embodiment, whether or not the value of the voltage V10 of the word line WL is higher than the reference voltage e1 can be detected by the comparator COMP1. Thus, the comparator COMP1 corresponds to a detector of the present invention.

In this embodiment, with the high level signal STOP outputted by the comparator COMP1, the third buffer circuits 71, 72 stop outputting of the sixth operation clock signal CLK6 and the seventh operation clock signal CLK7 to each of the second buffer circuits 21. Consequently, each level converting circuit 22 does not output the second operation clock signal CLK2B and the second operation clock signal CLK2C to the second pumping circuits 25D, 25E. Thus, the third buffer circuits 71, 72 correspond to a clock signal supply stop portion of the present invention.

Detecting whether or not the value of the voltage V10 of the word line WL is higher than the reference voltage e1 corresponds to a detecting step of the present invention. Further, it is detected that the value of the voltage V10 of the word line WL is higher than the reference voltage e1 and outputting of the sixth operation clock signal CLK6 and the seventh operation clock signal CLK7 is stopped with the high level signal STOP. Consequently, stopping of use of the second operation clock signal CLK2B and the second operation clock signal CLK2C without generating the sixth operation clock signal CLK6 and the seventh operation clock signal CLK7 corresponds to a clock signal supply stop step of the present invention.

If the second charge pump circuits 20A, 20D, 20E in which the second operation clock signal CLK5, the second operation clock signal CLK6 and the second operation clock signal CLK7 whose phases are different by 90° from each other are inputted, the second charge pump circuits 20A, 20D, 20E being connected in parallel, are provided like the voltage generating portion 1C of this embodiment, the voltage supply capacity of the voltage generating portion 1C can be raised by the three second charge pump circuits 20A, 20D, 20E. Then, the second charge pump circuits 20A, 20D, 20E can rise up the value of the pumping voltage V2 toward 9 V rapidly using the high voltage supply capacity.

Further, if it is detected that the value of the voltage V10 of the word line WL is higher than the value of the reference voltage e1 by the comparator COMP1 and outputting of the second operation clock signal CLK2B and the second operation clock signal CLK2C to the second pumping circuits 25D, 25E is stopped by the third buffer circuits 71, 72 as in the voltage generating portion 1C of this embodiment, the pumping operation of the second pumping circuits 25D, 25E can be stopped. Consequently, by executing the pumping operation of the second charge pump circuit 20A, which is one of the three second charge pump circuits 20A, 20D, 20E, the quantity of the operating second charge pump circuits can be reduced so as to save power consumption. Additionally, by the pumping operation of the second charge pump circuit 20A in which the second operation clock signal CLK2A is inputted, the power supply capacity can be secured thereby preventing the voltage V10 of the word line WL from dropping.

According to the control method of the voltage generating portion 1C of this embodiment, the second operation clock signal CLK5, the second operation clock signal CLK6 and the second operation clock signal CLK7 whose phases are different by 90° from each other are employed and the pumping operations of the second charge pump circuits 20A, 20D, 20E connected in parallel are executed so as to intensify the voltage supply capacity of the voltage generating portion 1C. Then, according to the control method of the voltage generating portion 1C of this embodiment, the value of the pumping voltage V2 can be raised up toward 9 V rapidly using the high voltage supply capacity.

Further, according to the control method of the voltage generating portion 1C of this embodiment, if it is detected that the value of the voltage V10 of the word line WL is higher than the value of the reference voltage e1 and outputting of the second operation clock signal CLK2B and the second operation clock signal CLK2C to the second pumping circuits 25D, 25E is stopped, the pumping operation of the second pumping circuits 25D, 25E can be stopped. Consequently, by executing the pumping operation of the second charge pump circuit 20A, which is one of the three second charge pump circuits 20A, 20D, 20E, the quantity of the operating second charge pump circuits can be reduced to save power consumption. Additionally, the power supply capacity can be secured by the pumping operation of the second charge pump circuit 20A in which the second operation clock signal CLK2A is inputted, so as to prevent the voltage V10 of the word line WL from dropping.

Figure 5:
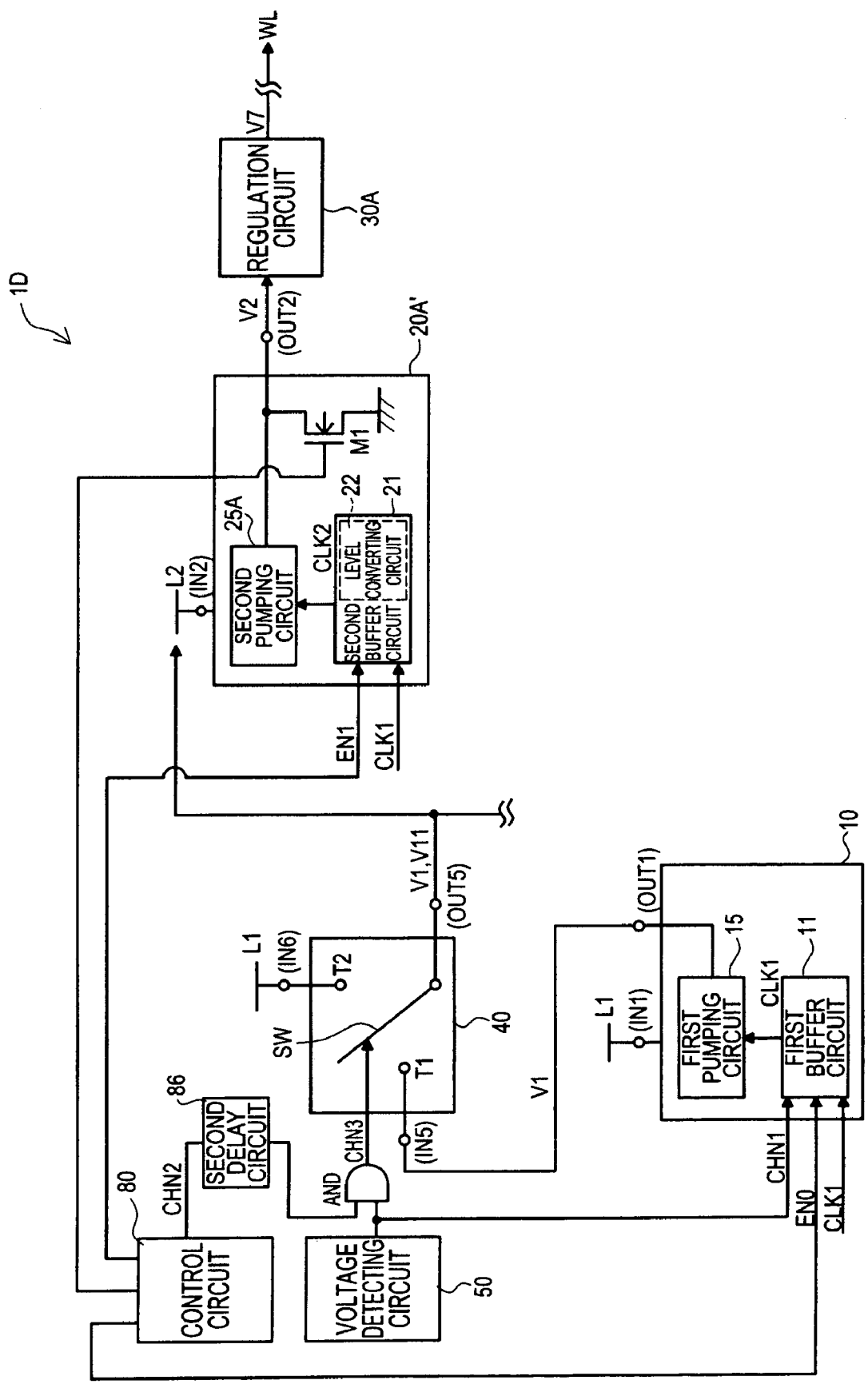
FIG. 5 is a block diagram showing part of the structure of the same voltage generating unit of the fifth embodiment.

A fifth embodiment of the present invention will be described with reference to FIG. 5. The same reference numerals are attached to the same components as the first embodiment and the like and description thereof is omitted. FIG. 5 is a block diagram showing part of the structure of the voltage generating portion 1D of this embodiment. FIG. 5 indicates a control circuit 80 whose representation is omitted in the first embodiment. The voltage generating portion 1D includes a second delay circuit 86 and an N type channel transistor M1.

The control circuit 80 is connected to the input of the first buffer circuit 11 of the first charge pump circuit 10, the input of the second buffer circuit 21 of the second charge pump circuit 20A' and the input of the second delay circuit 86. The output of the second delay circuit 86 is connected to the switch SW of the selection circuit 40 via a logical product gate circuit AND. The output of the voltage detecting circuit 50 is connected to the logical product gate circuit AND.

The drain of the N type channel transistor M1 is connected between the output of the second pumping circuit 25A and the output terminal (OUT2) of the second charge pump circuit 20A'. The source of the N type channel transistor M1 is connected to the ground. The gate of the N type channel transistor M1 is connected to the control circuit 80.

The operation of the voltage generating portion 1D will be described. An operation in case where it is detected that the value of the external power supply voltage is 1.8 V by the voltage detecting circuit 50 will be described. The voltage generating portion 1D outputs the low level control signal EN0 to the first buffer circuit 11 by the control circuit 80 to stop the pumping operation. Consequently, the first buffer circuit 11 does not output the first operation clock signal CLK1 to the first pumping circuit 15.

Additionally, the voltage generating portion 1D outputs the low level control signal EN1 to the second buffer circuit 21 by the control circuit 80 to stop the pumping operation. Consequently, the level converting circuit 22 does not output the second operation clock signal CLK2 to the second pumping circuit 25A.

Further, the voltage generating portion 1D outputs a high level gate control signal to the gate of the N type channel transistor M1 by the control circuit 80 to stop the pumping operation. Consequently, the gate of the N type channel transistor M1 is fixed to a high level voltage so that the N type channel transistor M1 is turned to ON. Therefore, by the pumping operation of the second pumping circuit 25A discussed above, electric charges accumulated in the pumping capacitor of the second pumping circuit 25A are discharged to the ground via the N type channel transistor M1. As a result, the value of the voltage V2 becomes lower than the value of the pumping voltage V1. The N type channel transistor M1 corresponds to an output voltage adjusting unit of the present invention.

Additionally, when the voltage generating portion 1D stops the pumping operation, it outputs the low level switch operation signal CHN2 to the second delay circuit 86 by the control circuit 80. The second delay circuit 86 outputs a signal obtained by delaying the phase of the switch operation signal CHN2 after a predetermined delay time elapses to the logical product gate circuit AND so as to change the switch operation signal CHN3 from high level to low level. The delay time of the second delay circuit 86 is set to a time required for the value of the voltage V2 to drop below the value of the pumping voltage V1.

The switch SW is connected from the terminal T1 to the terminal T2 by the second delay circuit 86 after the predetermined time elapses. According to this embodiment, the switch SW is connected from the terminal T1 to the terminal T2 when the value of the voltage V2 becomes lower than the value of the pumping voltage V1. An external power supply voltage of 1.8 V is supplied to the second pumping circuit 25A via the terminal T2, switch SW and the internal power supply line L2. The switch operation signal CHN3 corresponds to a connection instruction signal of the present invention. The second delay circuit 86 and the logical product gate circuit AND correspond to an instruction signal output portion of the present invention.

In this embodiment, lowering the value of the voltage V2 relative to the value of the pumping voltage V1 to stop the pumping operation corresponds to an output voltage adjusting step of the invention. In this embodiment, connecting the switch SW from the terminal T1 to the terminal T2 when the value of the voltage V2 is lowered relative to the pumping voltage V1 corresponds to an instruction step of the present invention.

In the voltage generating portion 1D of this embodiment, when the second operation clock signal CLK2 is stopped and the pumping operation of the second pumping circuit 25A is stopped, the value of the voltage V2 is lowered relative to the value of the pumping voltage V1 by the N type channel transistor M1 with the pumping voltage V1 having a voltage value of 3 V supplied to the internal power supply line L2. Consequently, the second pumping circuit 25A can discharge electric charges accumulated in the pumping capacitor of the second pumping circuit 25A to the ground securely and rapidly via the N type channel transistor M1 when it is not pumping the voltage. The reason is that if the value of the pumping voltage V1 is reset ahead, each internal node of each pumping stage in the second pumping circuit 25A constituted of a capacity parallel connection type charge pump in which the pumping capacitors are connected through a plurality of stages is not reset. Another reason is that if the voltage value of the internal power supply line L2 is changed to the value (1.8 V) of the external power supply line L1 which is lower than the value (3 V) of the pumping voltage V1, the reset speed of each internal node of each pumping stage in the second pumping circuit 25A is lowered.

In the voltage generating portion 1D of this embodiment, when the value of the voltage V2 is lowered relative to the value of the pumping voltage V1 by the N type channel transistor M1, the switch operation signal CHN3 for connecting the switch SW to the terminal T2 is outputted to the switch SW by the second delay circuit 86 and the logical product gate circuit AND. Then, in the voltage generating portion 1D of this embodiment, the switch SW can be connected to the terminal T2 after the value of the voltage V2 is lowered relative to the value of the pumping voltage V1 without connecting the switch SW to the terminal T2 before the value of the voltage V2 is lowered relative to the value of the pumping voltage V1. Thus, in the voltage generating portion 1D of this embodiment, when the switch SW is connected to the terminal T2 and the external power supply voltage of 1.8 V is supplied to the second pumping circuit 25A, electric charges accumulated in the pumping capacitor are discharged, so that the second charge pump circuit 20A' can be protected from a voltage stress originating from electric charges accumulated in the pumping capacitor. Thus, the voltage generating portion 1D of this embodiment can lower the voltage stress applied to the second charge pump circuit 20A' so as to intensify the operating reliability of the voltage generating portion 1D. If the value of the internal power supply line L2 is lowered relative to the value of the voltage V2 before the value of the voltage V2 is lowered relative to the value of the pumping voltage V1, the high level value of the second operation clock signal CLK2 is lowered from 3 V to 1.8 V. Consequently, a difference of voltage between the internal pumping node in which the second clock signal CLK2 in the second pumping circuit 25A is stopped at a high level and the second operation clock signal CLK2 rises temporarily so that the voltage stress is raised.

According to the control method of the voltage generating portion 1D of this embodiment, if the value of the voltage V2 is lowered relative to the value of the pumping voltage V1 when the pumping operation is stopped with no second operation clock signal CLK2 generated, electric charges accumulated in the pumping capacitor of the second pumping circuit 25A can be discharged when the second pumping circuit 25A is not pumping the voltage.

According to the control method of the voltage generating portion 1D of this embodiment, if the value of the voltage V2 is lowered relative to the value of the pumping voltage V1, the switch operation signal CHN3 of connecting the switch SW to the terminal T2 is outputted to the switch SW. Then, according to the control method of the voltage generating portion 1D of this embodiment, the switch SW can be connected to the terminal T2 after the value of the voltage V2 is lowered relative to the value of the pumping voltage V1 without connecting the switch SW to the terminal T2 before the value of the voltage V2 is lowered relative to the value of the pumping voltage V1. Therefore, according to the control method of the voltage generating portion 1D of this embodiment, when the switch SW is connected to the terminal T2 and the external power supply of 1.8 V is supplied to the second pumping circuit 25A, electric charges accumulated in the pumping capacitor are discharged, so that the second charge pump circuit 20A can be protected from a voltage stress originating from electric charges accumulated in the pumping capacitor. For the reason, according to the control method of the voltage generating portion 1D of this embodiment, the voltage stress applied to the second charge pump circuit 20A' can be reduced so as to intensify the operating reliability of the voltage generating portion 1D.

Figure 6:
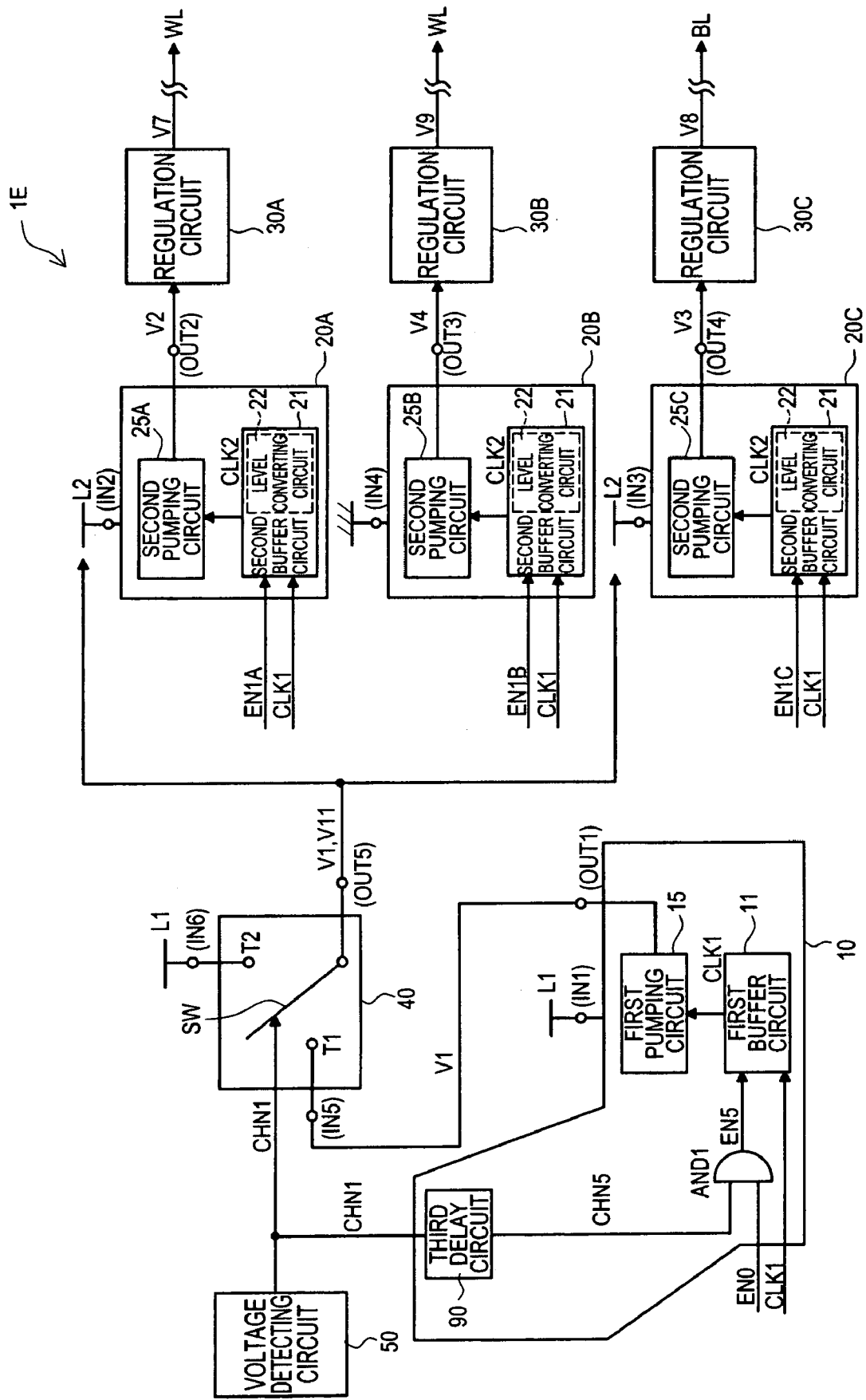
FIG. 6 is a block diagram showing the structure of the same voltage generating unit of the sixth embodiment.

The sixth embodiment of the present invention will be described with reference to FIG. 6. Same reference numerals are attached to the same components as the first embodiment and description thereof is omitted. FIG. 6 is a block diagram showing the structure of the voltage generating portion 1E of this embodiment. The voltage generating portion 1E includes a third delay circuit 90 and a logical product gate circuit AND1 as well as the voltage generating portion 1 of the first embodiment.

The input of the third delay circuit 90 is connected to the output of the voltage detecting circuit 50. The output of the third delay circuit 90 is connected to the first input of the logical product gate circuit AND1. The second input of the logical product gate circuit AND1 is connected to a control circuit (not shown). The output of the logical product gate circuit AND1 is connected to the first buffer circuit 11 of the first charge pump circuit 10.

Next, the operation of the voltage generating portion 1E will be described. An operation in case where it is detected that the value of the external power supply voltage is 1.8 V by the voltage detecting circuit 50 will be described. The voltage detecting circuit 50 outputs the high level selection signal CHN1 to the switch SW of the selection circuit 40 and the third delay circuit 90. When the switch SW receives the high level selection signal CHN1, it is connected to the terminal T1.

The third delay circuit 90 generates the high level selection signal CHN5 in which the phase of the high level selection signal CHN1 is delayed after a predetermined delay time elapses. The third delay circuit 90 is set to a longer time than time required until the switch SW is connected to the terminal T1. In the meantime, the selection signal CHN5 corresponds to a delay signal of the invention.

The high level control signal EN0 is inputted to the second input of the logical product gate circuit AND1 by the control circuit. The control signal EN0 corresponds to an activation control signal of the invention. When the high level selection signal CHN5 is inputted to the first input by the third delay circuit 90, the logical product gate circuit AND1 outputs the high level control signal EN5 to the first buffer circuit 11. The phase of the high level control signal EN5 to be inputted to the first buffer circuit 11 is delayed with respect to the phase of the selection signal CHN1 because the phase of the selection signal CHN5 which generates the control signal EN5 is delayed with respect to the phase of the selection signal CHN1.

The first buffer circuit 11 outputs the first operation clock signal CLK1 having an amplitude of 1.8 V to the first pumping circuit 15. The first pumping circuit 15 starts its pumping operation and supplies the pumping voltage V1 to the internal power supply line L2 through the input terminal (IN5) of the selection switch 40, the terminal T1, the switch SW and the output terminal (OUT5).

According to this embodiment, the selection signal CHN5 whose phase is delayed with respect to the selection signal CHN1 can be generated by the third delay circuit 90. Therefore, the third delay circuit 90 corresponds to a delay portion of the invention.

According to this embodiment, if the high level selection signal CHN5 and the high level control signal EN0 are inputted, the logical product gate circuit AND1 outputs the high level control signal EN5 to the first buffer circuit 11. The control signal EN5 corresponds to a voltage generation instruction signal of the present invention because it outputs the first operation clock signal CLK1 which starts the pumping operation of the first pumping circuit 15 to the first pumping circuit 15 through the first buffer circuit 11. Further, the logical product gate circuit AND1 corresponds to a generating portion of the present invention because it outputs the control signal EN5. In this embodiment, the third delay circuit 90 and the logical product gate circuit AND1 constitute a voltage generating adjusting unit of the invention.

Generating the selection signal CHN5 whose phase is delayed with respect to the selection signal CHN1 corresponds to a delay step of the present invention. Further, outputting the high level control signal EN5 using the high level selection signal CHN5 and the high level control signal EN0 corresponds to a generation step of the invention. Generating the pumping voltage V1 by the first operation clock signal CLK1 having an amplitude of 1.8 V after the switch SW is connected to the terminal T1 by the high level selection signal CHN1 corresponds to a voltage generation adjusting step of the present invention.

In the voltage generating portion 1E of this embodiment, the first buffer circuit 11 outputs the first operation clock signal CLK1 which starts the pumping operation of the first pumping circuit 15 to the first pumping circuit 15 based on the control signal EN5 which is a result of logical product operation between the selection signal CHN5 and the control signal EN0 after the switch SW is connected to the terminal T1. Therefore, in the voltage generating portion 1E of this embodiment, the first pumping circuit 15 can generate the pumping voltage V1 through the input terminal (IN5) of the selection circuit 40, the terminal T1, the switch SW and the output terminal (OUT5) in a condition in which the second charge pumps 20A, 20C are connected to the first charge pump 10. Then, the voltage generating portion 1E of this embodiment can prevent the first pumping circuit 15 from getting into a unstable condition which generates the pumping voltage V1 rapidly in a condition in which the second charge pump circuits 20A, 20C are not connected to the first charge pump circuit 10.

In the voltage generating portion 1E of this embodiment, the logical product gate circuit AND1 outputs the control signal EN5 for the first operation clock signal CLK1 which starts the pumping operation of the first pumping circuit 15 to pass the first buffer circuit 11 based on the selection signal CHN5 generated by the third delay circuit 90 and the control signal EN0. Then, in the voltage generating portion 1E of this embodiment, after the switch SW receives the selection signal CHN1 and is connected to the terminal T1, the logical product gate circuit AND1 can generate the control signal EN5 for the first operation clock signal CLK1 which starts the pumping operation of the first pumping circuit 15 to pass the first buffer circuit 11.

According to the control method of the voltage generating portion 1E of this embodiment, after the switch SW is connected to the terminal T1, it outputs the first operation clock signal CLK1 which starts the pumping operation of the first pumping circuit 15 to the first pumping circuit 15 based on the control signal EN5. Thus, according to the control method of the voltage generating portion 1E of this embodiment, the pumping voltage V1 can be generated via the input terminal (IN5) of the selection circuit 40, the terminal T1, the switch SW and the output terminal (OUT5) in a condition in which the second charge pump circuits 20A, 20C are connected to the first charge pump circuit 10. Consequently, according to the control method of the voltage generating portion 1E of this embodiment, the first pumping circuit 15 can be prevented from getting into an unstable condition which generates the pumping voltage V1 quickly in the condition in which the second charge pump circuits 20A, 20C are not connected to the first charge pump circuit 10.

According to the control method of the voltage generating portion 1E of this embodiment, the control signal EN5 is outputted for the first operation clock signal CLK1 which starts the pumping operation of the first buffer circuit 15 to pass the first buffer circuit 11, based on the selection signal CHN5 and the control signal EN0. Then, according to the control method of the voltage generating portion 1E of this embodiment, after the switch SW receives the selection signal CHN1 and is connected to the terminal T1, the control signal EN5 can be generated for the first operation clock signal CLK1 which starts the pumping operation of the first pumping circuit 15 to pass the first buffer circuit 11.

Figure 7:
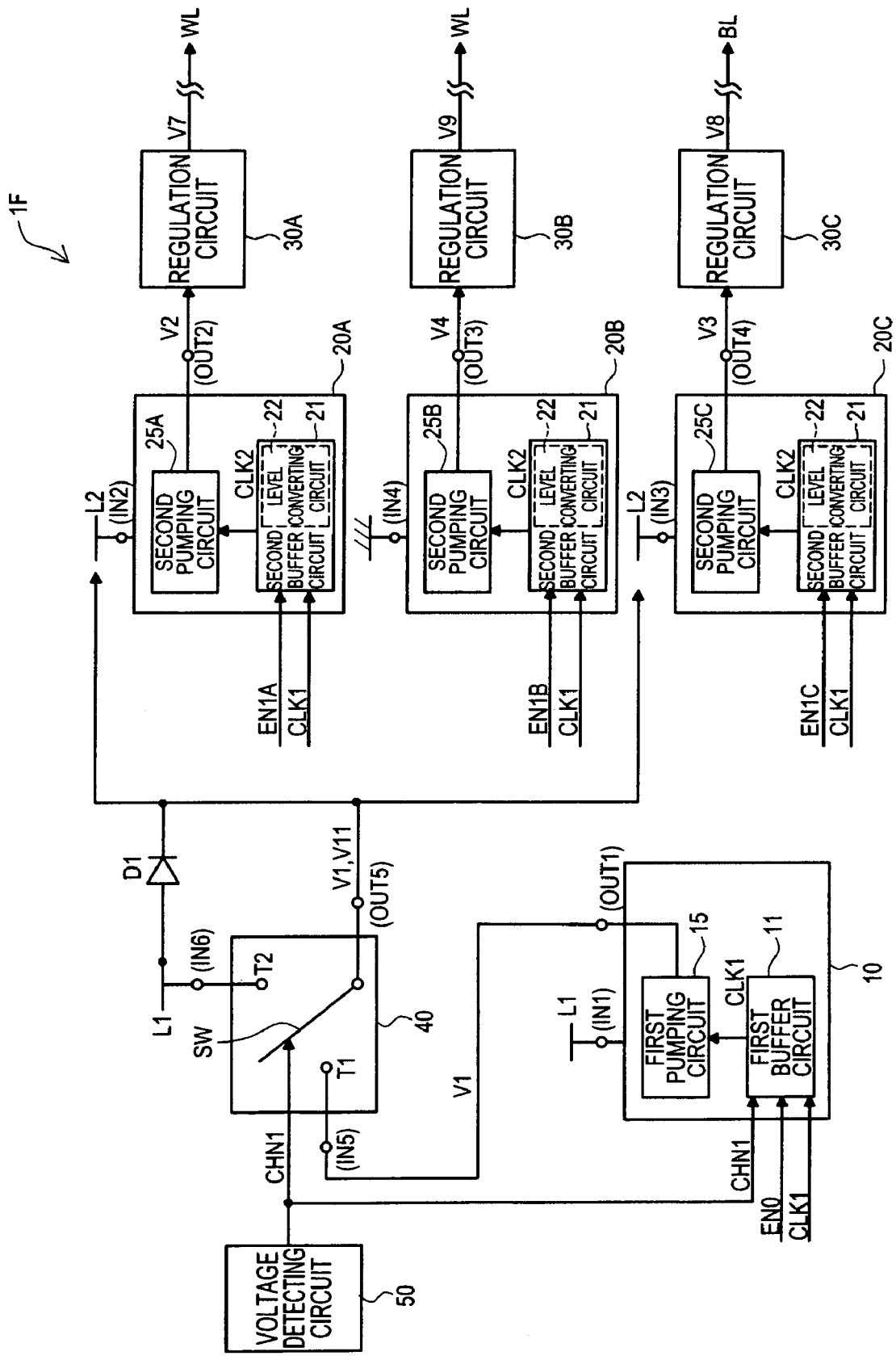
FIG. 7 is a block diagram showing the structure of the same voltage generating unit of the seventh embodiment.

The seventh embodiment of the present invention will be described with reference to FIG. 7. Same reference numerals are attached to the same components as the first embodiment and description thereof is omitted. FIG. 7 is a block diagram showing the structure of the voltage generating portion 1F of this embodiment. The voltage generating portion 1F includes a diode D1 as well as the voltage generating portion 1 of the first embodiment. The anode of the diode D1 is connected to the external power supply line L1. The cathode of the diode D1 is connected to the internal power supply line L2.

The voltage generating portion 1F is operated as follows when it is started. An operation in case where the value of the external power supply voltage is set to 1.8 V will be described here. A voltage of 1.8 V is applied to the diode D1 by the external power supply line L1. Consequently, the diode D1 conducts in forward direction.

If the diode D1 conducts in the forward direction, the value of a voltage supplied to the internal power supply line L2 is assisted by 1.2 V which is the value of the external power supply minus 0.6 V (−0.6 V is a threshold of the diode). Then, when the voltage generating portion 1F is started, the diode D1 can assist the supply of voltage to the internal power supply line L2 by the external power supply line L1 connected to the first charge pump circuit 10 which reaches the predetermined voltage (3 V) slowly. In the meantime, if the value of the external power supply voltage is set to 3 V, the value of the voltage supplied to the internal power supply line L2 is assisted by 2.4 V rapidly because the transistor current drive capacity of the switch SW of the selection circuit 40 is assisted by the diode D1.

In this embodiment, the current drive capacity of the second charge pump or the selection circuit is assisted by a voltage supplied to the internal power supply line L2 by the diode D1 at the time of the initial operation of the voltage generating portion 1F. Thus, the diode D1 constitutes the assist circuit of the present invention. The diode D1 corresponds to an assist diode of the present invention.

In the voltage generating portion 1F of this embodiment, the value of the voltage supplied to the second charge pump circuits 20A, 20C is assisted to a predetermined voltage value (1.2 V or 2.4 V) so as to bring the value of that voltage supplied to the second charge pump circuits 20A, 20C close to the voltage value (1.8 V) of the first external power supply or the voltage value (3 V) of the second external power supply, so that a voltage which secures the voltage value of 1.2 V or 2.4 V can be supplied to the second charge pump circuits 20A, 20C early. Thus, in the voltage generating portion 1F of this embodiment, the second charge pump circuits 20A, 20C can be prevented from continuing an unstable condition without being supplied with any voltage in an initial condition such as the time of the startup of the voltage generating portion 1F, thereby preventing the second charge pump circuits 20A, 20C from malfunctioning and permitting the second charge pump circuits 20A, 20C to start the operations early.

In the voltage generating portion 1F of this embodiment, provision of the diode D1 connected between the external power supply line L1 and the internal power supply line L2 allows a voltage of 1.8 V or 3 V to be applied to the diode D1 through the external power supply line L1, so that the diode D1 conducts. In the voltage generating portion 1F of this embodiment, when the diode D1 conducts, a voltage which operates the second charge pump circuits 20A, 20C properly and early in the initial condition such as the time of start-up of the second charge pump circuits 20A, 20C can be applied without any control by monitoring the voltage applied to the second charge pump circuits 20A, 20C.

According to the control method of the voltage generating portion 1F of this embodiment, the value of the voltage supplied to the second charge pump circuits 20A, 20C is assisted to a predetermined voltage value (1.2 V or 2.4 V) so as to bring the value of that voltage close supplied to the second charge pump circuits 20A, 20C to the voltage value (1.8 V) of the first external power supply or the voltage value (3 V) of the second external power supply, so that a voltage which secures the voltage value of 1.2 V or 2.4 V can be supplied to the second charge pump circuits 20A, 20C. Thus, according to the control method of the voltage generating portion 1F of this embodiment, the second charge pump circuits 20A, 20C can be prevented from continuing an unstable condition without being supplied with any voltage in an initial condition such as the time of the startup of the voltage generating portion 1F, thereby preventing the second charge pump circuits 20A, 20C from malfunctioning and permitting the second charge pump circuits 20A, 20C to start the operations early.

The present invention is not restricted to the above-described embodiments but may be implemented by changing part of the structure appropriately within a range not departing from the spirit of the present invention. Although the voltage generating portion 1 of the above-described first embodiment generates the second operation clock signal CLK2 having an amplitude of 3 V with the first operation clock signal CLK1 and the high level control signals EN1A-EN1C, the second pumping circuits 25A-25C may start the pumping operation with the control signals EN1A-EN1C after the second operation clock signal CLK2 having an amplitude of 3 V is generated with the first operation clock signal CLK1. Although the voltage generating portion 1B of the above-described third embodiment includes the three second charge pump circuits 20A, 20D, 20E, the voltage generating portion may include three or more second charge pump circuits. Further, different from the third embodiment, the voltage generating portion may include three first charge pump circuits as well as the three second charge pump circuits.

Distinguishable from the voltage generating portion 1C of the fourth embodiment, the voltage generating portion may be provided in any one of the third buffer circuit 71 and the third buffer circuit 72. If the voltage generating portion includes three first charge pump circuits as well as the three second charge pump circuits 20A, 20D, 20E, one or more third buffer circuits connected to each first charge pump circuit may be included.

Distinguishable from the voltage generating portion 1D of the fifth embodiment, the voltage generating portion may include the P type channel transistor instead of the N type channel transistor M1. In this voltage generating portion, the drain of the P type channel transistor is connected between the output of the second pumping circuit 25A and the output terminal (OUT2) of the second charge pump circuit 20A'. The source of the P type channel transistor is connected to the external power supply line L1. The gate of the P type channel transistor is connected to the control circuit 80.

Distinguishable from the voltage generating portion 1D of the fifth embodiment, the voltage generating portion may control the switch SW to change from the terminal T1 to the terminal T2 corresponding to a result of detection of the voltage detecting portion connected to the output terminal (OUT2) of the second charge pump circuit 20A'. In this case, the voltage detecting portion detects that the value of the voltage V2 is lowered relative to the value of the pumping voltage V1 by the P type channel transistor and the control circuit 80 outputs the low level switch operation signal CHN2 without use of the second delay circuit 86.

Distinguishable from the voltage generating portion 1E of the sixth embodiment described above, the voltage generating portion may include the third delay circuit 90 between the control circuit and the logical product gate circuit AND1, the third delay circuit 90 generating signals by delaying the control signal EN0.

What is claimed is:

1. A voltage generating circuit in which a plurality of charge pumps are arranged between an input and an output, comprising:
    a first charge pump unit to which a first clock signal having a first voltage level is inputted, the first charge pump unit generating a first precharge pumping voltage by pumping a voltage of a first external power supply in stages by a first voltage;
    a voltage selector that is coupled to any one of the first power supply and a second external power supply having a higher voltage value than the first external power supply, the voltage selector selecting from the first precharge pumping voltage generated by the first charge pump unit or the voltage of the second external power supply, in accordance with a voltage selection command signal;
    a level converter that converts a voltage level of the first clock signal into a second voltage level that is higher than the first voltage level; and
    a second charge pump unit to which a second clock signal having the second voltage level is inputted, the second charge pump unit generating a second precharge pumping voltage by pumping the first precharge pumping voltage or the voltage of the second external power supply selected by the voltage selector in stages by a second voltage with a greater potential difference than the first voltage.

2. The voltage generating circuit according to claim 1, further comprising a voltage generation adjusting unit by which the first charge pump unit generates the first precharge pumping voltage after the first precharge pumping voltage is selected by the voltage selector.

3. The voltage generating circuit according to claim 2, wherein the voltage generation adjusting unit includes a delay unit that delays a phase of at least one signal from the voltage selection command signal and an activation control signal of the first charge pump unit so as to generate a delay signal, and a generation unit that, in accordance with the delay signal or the at least one signal generates a voltage generation command signal for generating the first precharge pumping voltage.

4. The voltage generating circuit according to claim 1, further comprising an assist circuit that assists a voltage value to be applied to the second charge pump unit so as to approximate the voltage value of the first external power supply or to the voltage value of the second external power supply.

5. The voltage generating circuit according to claim 4, wherein the assist circuit includes an assist diode that is connected between a power line of the first external power supply and the second charge pump unit, or between a power line of the second external power supply and the second charge pump unit.

6. The voltage generating circuit according to claim 3, the voltage generating circuit further comprising:
    an output voltage adjusting unit that, when the first precharge pumping voltage has been selected by the voltage selection unit, lowers an output voltage value of the second charge pump unit after the second charge pump unit is stopped; and
    a command signal output unit that, after the output voltage
    a command signal output unit that, after the output voltage value is lowered than a reference voltage value, outputs a connection command signal that instructs the voltage selection unit to connect with the first external power supply.

7. The voltage generating circuit according to claim 1 further comprising a clock signal delay unit that delays a phase of the first clock signal to be inputted to the first charge pump than a phase of the second clock signal to be inputted to the second charge pump unit.

8. The voltage generating circuit according to claim 1, wherein plurality of charge pump units of at least one of the first charge pump unit and the second charge pump unit are connected in parallel to each other, the voltage generating circuit further comprising a phase adjusting unit that brings the phases of clock signals of at least one of the first clock signal to be inputted to the first charge pump unit and the second clock signal to be inputted to the second charge pump unit to be different from each other.

9. The voltage generating circuit according to claim 8, wherein plurality of the second charge pump units are connected in parallel to each other, comprising:
    a detector that detects that a voltage value changing in accordance with an output voltage value of the second charge pump unit has become higher than a predetermined voltage value;
    a clock signal supply stopping unit that, in accordance with a detection result of the detector, stops input of the second clock signal to at least one second charge pump unit of the plurality of second charge pump units.

10. A control method of a voltage generating circuit including a plurality of pumping steps for generating a precharge pumping voltage between an input and an output, comprising:
    a first pumping step that uses a first clock signal having a first voltage level so as to generate a first precharge pumping voltage, by pumping a voltage of a first external power supply in stages by a first voltage;
    a voltage selecting step that uses the first external power supply or a second external power supply having a higher voltage value than the first external power supply so as to select from the first precharge pumping voltage generated by the first pumping step and a voltage of the second external power supply, in accordance with a voltage selection command signal;
    a level converting step that converts a voltage level of the first clock signal to a second voltage level that is higher than the first voltage level, and
    a second pumping step that uses the second clock signal having the second voltage level converted by the level converting step so as to generate a second precharge pumping voltage by pumping the first precharge pumping voltage or the voltage of the second external power supply selected by the voltage selecting step in stages by a second pumping step with a greater potential difference than the first voltage.

11. The control method according to claim 10, further comprising a voltage generation adjusting step by which the first pumping step generates the first precharge pumping voltage after the first precharge pumping voltage is selected by the voltage selecting step.

12. The control method according to claim 11, wherein the voltage generation adjusting step comprises:
- a delay step that delays a phase of at least one signal of the voltage selection command signal and an activation control signal of the first charge pump unit so as to generate a delay signal, and
- a generation step that, in accordance with the delay signal or the at least one signal, generates a voltage generation command signal for generating the first precharge pumping voltage.

13. The control method according to claim 10, the method further comprising the step of:
- assisting a voltage value to be used in the second pumping step so as to approximate the voltage value of the first external power supply or to the voltage value of the second external power supply.

14. The control method according to claim 12, the control method further comprising the steps of:
- output voltage adjusting step that, when the first precharge pumping voltage has been selected by the voltage selecting step, lowers an output voltage value generated by the second pumping step after the second pumping step is stopped, and
- instruction step that, after the output voltage value generated by the second pumping step is lowered than a reference voltage value, instructs the voltage selecting step to use the first external power supply in the voltage selecting step.

15. The control method according to claim 10, the control method further comprising a clock signal delay step that delays a phase of the first clock signal to be used in the first pumping step than a phase of the second clock signal to be used in the second pumping step.

16. The control method according to claim 10, wherein a plurality of pumping steps of at least one of the first pumping step and the second pumping step are executed in parallel, the control method further comprising a phase adjusting step that brings the phases of clock signals of at least one of the first clock signal to be used in the first pumping step and the second clock signal to be used in the second pumping step to be different from each other.

17. The control method according to claim 16, wherein a plurality of the second pumping steps are executed in parallel, comprising:
- a detecting step that detects that a voltage value changing in accordance with an output voltage value of the second pumping step has become higher than a predetermined voltage value; and
- a clock signal supply stopping step that, in accordance with a detection result of the detecting step, stops use of the second clock signal in at least one second pumping step of the plurality of second pumping steps.

18. A nonvolatile storage device, comprising a voltage generating circuit in which a plurality of charge pumps are arranged between an input and an output, comprising: a first charge pump unit to which a first clock signal having a first voltage level is inputted, the first charge pump unit generating a first precharge pumping voltage by pumping a voltage of a first external power supply in stages by a first voltage; a voltage selector that is connected to any one of the first power supply and a second external power supply having a higher voltage value than the first external power supply, the voltage selector selecting from the first precharge pumping voltage generated by the first charge pump unit or the voltage of the second external power supply, in accordance with a voltage selection command signal; a level converter that converts a voltage level of the first clock signal into a second voltage level that is higher than the first voltage level; and a second charge pump unit to which a second clock signal having the second voltage level is inputted, the second charge pump unit generating a second precharge pumping voltage by pumping the first precharge pumping voltage or the voltage of the second external power supply selected by the voltage selector in stages by a second voltage with a greater potential difference than the first voltage,
- wherein, a first control signal that maintains activity of the first charge pump unit is inputted to the first charge pump unit, and
- a second control signal that is different control signal from the first control signal and maintains activity of the second charge pump is inputted to the second charge pump unit.

19. The nonvolatile storage device according to claim 18, comprising:
- a program mode that executes writing into a nonvolatile memory element, and
- an erase mode that executes erasing from the nonvolatile memory element,
- wherein the second charge pump includes a third charge pump unit that generates a first voltage in accordance with the program mode, and a fourth charge pump unit that generates a second voltage in accordance with the erase mode.

* * * * *